(12) United States Patent  
Staszewski et al.

(10) Patent No.: US 9,020,027 B2  
(45) Date of Patent: **\*Apr. 28, 2015**

(54) INTEGRATED CIRCUIT, COMMUNICATION UNIT AND METHOD FOR IMPROVED AMPLITUDE RESOLUTION OF AN RF-DAC

(71) Applicant: MediaTek Singapore Pte. Ltd., Singapore (SG)

(72) Inventors: Robert Bogdan Staszewski, Delft (NL); Min Park, Stanford, CA (US)

(73) Assignee: MediaTek Singapore Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 14/162,749

(22) Filed: Jan. 24, 2014

(65) Prior Publication Data

US 2014/0185663 A1 Jul. 3, 2014

Related U.S. Application Data

(63) Continuation of application No. 13/018,394, filed on Jan. 31, 2011, now Pat. No. 8,675,725.

(60) Provisional application No. 61/329,159, filed on Apr. 29, 2010, provisional application No. 61/407,186, filed on Oct. 27, 2010.

(51) Int. Cl.  
*H03K 7/08* (2006.01)  
*H03F 3/217* (2006.01)  
(Continued)

(52) U.S. Cl.  
CPC ............... *H03K 7/08* (2013.01); *H03F 3/2176* (2013.01); *H03M 1/68* (2013.01); *H03M 1/747* (2013.01); *H03M 1/822* (2013.01); *H04B 14/026* (2013.01)

(58) Field of Classification Search  
CPC ........................................ H04B 14/026  
USPC .......................................... 375/238  
See application file for complete search history.

(56) References Cited

U.S. PATENT DOCUMENTS 6,141,541 A 10/2000 Midya  
6,924,681 B2 8/2005 Staszewski  
(Continued)

FOREIGN PATENT DOCUMENTS

CN 101036359 A 9/2007  
JP H07226635 A 8/1995  
(Continued)

OTHER PUBLICATIONS

Staszewski, R.B. et al., "Sigma-delta noise shaping for digital-to-frequency and digital-to-RF-amplitude conversion", System-on-Chip for Real-Time Applications, 2005 IEEE Computer Society, Proceedings of the 9th International Database Engineering & Application Symposium (IDEAS'05). Fifth International Workshop, Jul. 20-24, 2005.

(Continued)

*Primary Examiner* — Lihong Yu  
(74) *Attorney, Agent, or Firm* — Winston Hsu; Scott Margo

(57) ABSTRACT

An integrated circuit includes: a digitally-controlled power generation stage for converting an input signal to a radio frequency (RF) carrier, the digitally-controlled power generation stage including a plurality of selectable switching devices capable of adjusting an envelope of the RF carrier; and a pulse width modulator (PWM) generator arranged to generate a PWM control signal according to a fractional word and operably coupleable to the plurality of selectable switching devices of the digitally-controlled power generation stage; wherein the PWM generator inputs the PWM control signal to a subset of the plurality of the selectable switching devices such that a PWM signal adjusts the envelope of the RF carrier output from the digitally-controlled power generation stage.

22 Claims, 30 Drawing Sheets

(51) Int. Cl.
  *H03M 1/68* (2006.01)
  *H04B 14/02* (2006.01)
  *H03M 1/74* (2006.01)
  *H03M 1/82* (2006.01)

(56) References Cited

U.S. PATENT DOCUMENTS

| | | | |
|---|---|---|---|
| 7,667,511 | B2 | 2/2010 | Staszewski |
| 7,693,498 | B2 | 4/2010 | Rofougaran |
| 8,675,725 | B2 * | 3/2014 | Staszewski et al. ........... 375/238 |
| 2002/0180547 | A1 | 12/2002 | Staszewski |
| 2006/0284673 | A1 | 12/2006 | Peruzzi |
| 2006/0291589 | A1 | 12/2006 | Eliezer |
| 2009/0218995 | A1 | 9/2009 | Ahn |

FOREIGN PATENT DOCUMENTS

| | | |
|---|---|---|
| JP | H10126159 A | 5/1998 |
| JP | 2002158544 A | 5/2002 |

OTHER PUBLICATIONS

Eloranta, A Multimode Transmitter in 0.13 um CMOS Using Direct-Digital RF Modulator, IEEE Journal of Solid-State Circuits, pp. 2774-2784, vol. 42, No. 12, Dec. 2007.

Jerng, A Wideband Delta-Sigma Digital-RF Modulator for High Data Rate Transmitters, IEEE Journal of Solid-State Circuits, pp. 1710-1722, vol. 42, No. 8, Aug. 2007.

Mehta, An Efficient Linearization Scheme for a Digital Polar EDGE Transmitter, IEEE Transactions on Circuits and Systems-II:Express Briefs, pp. 193-197, vol. 57, No. 3, Mar. 2010.

Meninger, A Fractional-N Frequency Synthesizer Architecture Utilizing a Mismatch Compensated PFD/DAC Structure for Reduced Quantization-Induced Phase Noise, IEEE Transactions on Circuits and Systems-II:Analog and Digital Signal Processing, pp. 839-849, vol. 50, No. 11, Nov. 2003.

Park, A Time-Domain Resolution Improvement of an RF-DAC, IEEE Transactions on Circuits and Systems-II:Express Briefs, pp. 517-521, vol. 57, No. 7, Jul. 2010.

Staszewski, All-Digital PLL and Transmitter for Mobile Phones, IEEE Journal of Solid-State Circuits, pp. 2469-2482, vol. 40, No. 12, Dec. 2005.

Staszewski, Just-In-Time Gain Estimation of an RF Digitally-Controlled Oscillator for Digital Direct Frequency Modulation, IEEE Transactions on Circuits and Systems-II:Analog and Digital Signal Processing, pp. 887-892, vol. 50, No. 11, Nov. 2003.

Mehta, A 0.8mm2 All-Digital SAW-Less Polar Transmitter in 65nm EDGE Soc, pp. 58-59, Figure 3.2.7, ISSCC 2010/Session 3/Cellular Techniques/3.2, Feb. 8, 2010.

Nielsen, An RF Pulse Width Modulator for Switch-Mode Power Amplification of Varying Envelope Signals, pp. 277-280, 2007 Topical Meeting on Silicon Monolithic Integrated Circuits in RF Systems, Jan. 2007.

Perrott, Fast and Accurate Behavioral Simulation of Fractional-N Frequency Synthesizers and other PLL/DLL Circuits, pp. 498-503, 39th Design Automation Conference, 2002, Jun. 2002.

M.O. Hawksford, "Linearization of Multilevel, Multiwidth Digital PWM with Applications in Digital-to-Analog Conversion", Journal of the Audio Engineering Society, Oct. 1995, pp. 787-798, vol. 43, No. 10, Audio Engineering Society, England.

* cited by examiner

INTEGRATED CIRCUIT, COMMUNICATION UNIT AND METHOD FOR IMPROVED AMPLITUDE RESOLUTION OF AN RF-DAC

CROSS REFERENCE TO RELATED APPLICATIONS

This application is a continuation of co-pending U.S. patent application Ser. No. 13/018,394 (filed on Jan. 31, 2011), which claims the benefit of U.S. provisional application No. 61/329,159 (filed on Apr. 29, 2010) and U.S. provisional application No. 61/407,186 (filed on Oct. 27, 2010), the contents of which are incorporated herein by reference.

BACKGROUND

The field of this invention relates to radio-frequency digital-to-amplitude converter(s) (RF-DAC(s)). The invention is applicable to, but not limited to, radio-frequency digital-to-amplitude converter(s) (RF-DAC(s)) employing pulse width modulation.

One of the most important radio frequency (RF) architectural/circuit changes in the last decade has been the digitization of RF transceivers, such that digital functionality in the RF domain is now a key aspect for most wireless applications. Thus, for low-cost and low-power wireless devices, system-on-chip (SoC) integration of RF circuits with digital circuits has proven to be popular. One example of this is in digital RF transmitters, which now comprise digital application specific integrated circuit (ASIC) cells and one or more radio-frequency digital-to-amplitude converter(s) (RF-DAC(s)).

Some recent publications on RF transmitters have shown that employing an RF-DAC can make RF SoC implementation easier, for example R. Staszewski, et al. "All-digital PLL and transmitter for mobile phones", published in IEEE J. Solid-State Circuits, vol. 40, no. 12, pp 2469-2482, December 2005 [1], J. Mehta, et al. "A 0.8 mm2 11-digital SAW-less polar transmitter in 65 nm EDGE SoC", published in Proc. of IEEE Solid-State Circuits Conf, pp 58-59, December 2010 [2], A. Jerng, et al. "A wideband sigma-delta digital RF modulator for high data rate transmitters", published in IEEE Solid-State Circuits, vol. 42, no. 8, pp 1710-1722, Aug. 2007 [3], P. Eloranta, et al. "A multimode Transmitter in 0.13 m Using Direct-Digital RF Modulator", published in IEEE J. Solid-State Circuits, vol. 42, no. 12, pp 2774-2784, December 2007 [1]. Among them, the commercial single-chip GSM/EDGE transceiver in [1, 2] is unique in that it uses a simple array of unit-weighted transistor switches to control the output RF amplitude, which operates as near class-E power amplifier, instead of using a traditional current-source based DAC structure.

Concurrently to the digitization of RF transceivers, the RF performance requirements in wireless applications have been increasing, for example to support surface acoustic wave (SAW) filter removal, multi-mode operation, multi-band operation, to meet coexistence requirements, etc. It is known that RF-DAC's need to achieve extremely-high resolution performance levels, which have so far been difficult to achieve in a practical, cost-effective manner. The traditional means of amplitude resolution in RF-DACs is limited due to device mismatches, where the typical method of $\Sigma\Delta$ dithering through noise shaping does not work well in SAW-less and multi-radio systems.

FIG. 1 illustrates the polar transmitter 100 introduced in [1, 2]. The I/Q baseband data is converted into digital amplitude modulation (AM) and phase/frequency modulation (PM/FM) signals. The frequency signal is fed into the DCO-based $N_F$-bit digital-to-frequency converter (DFC), which generates a digital phase-modulated RF carrier by means of an all-digital PLL (ADPLL). The amplitude signal drives the $N_A$-bit digital-to-RF-amplitude converter (DRAC), which includes a digitally-controlled power amplifier (DPA).

The DPA controls the envelope of the phase-modulated RF carrier, hence it is considered an RF-DAC. The DPA is different from the traditional RF-DACs in [3] or [4], because it does not use current sources. Therefore, the DPA is more compatible with low-voltage and low-cost digital CMOS processes than the traditional RF-DAC. Lack of current sources in the DPA results in somewhat compressed transfer function, but the look-up-table (LUT) for AM-AM and AM-PM predistortion in the amplitude signal path shown in FIG. 1 linearizes the DPA transfer function.

Referring now to FIG. 1, a known polar transmitter based on a DCO and DPA circuits from [2] is illustrated. For simplicity purposes, the all-digital PLL around the DCO is not shown. References [1, 2] have proved that the architecture in FIG. 1 is feasible for SoC meeting all GSM and EDGE specifications. However, the resolution of the amplitude modulation path is limited by lithography and RF mismatches (i.e., both amplitude and phase/delay) of the unit switching devices in the DPA, and, consequently, the polar transmitter has little margin in the far-out (i.e., the associated RX band) noise limit of the SAW-less operation for EDGE.

The amplitude resolution could be improved by $\Sigma\Delta$ dithering of the unit transistor switches [1, 2]. However, the quantization noise is pushed to higher frequencies where emission requirements might sometimes be difficult to satisfy, especially when considering radio coexistence in a wireless connectivity (e.g., Bluetooth, WLAN) or in a multi-core RF-SoC environment.

Referring now to FIG. 2, a known concept 200 of achieving amplitude modulation (AM) through pulse width modulation (PWM) is illustrated. As shown, in the graphical waveform, the RF output amplitude is "proportional" to the duty cycle of a power amplifier input (PA_IN) signal. A duty cycle of the AM signal is controlled through precise delay.

The output amplitude of a PWM signal at the frequency of interest, however, is incorrect if the pulsewidth is chosen in a straightforward way, such that the DC amplitude of the PWM signal is correct, as illustrated in S. E. Meninger and M. H. Perrott, titled "A fractional-N synthesizer architecture utilising a mismatch compensated PFD/DAC structure for reduced quantization-induced phase noise" published in IEEE Trans. Circuits Systems, vol. 50, issue 11, pp. 839-849, November 2003[7], which is incorporated herein by reference and S. E. Meninger and M. H. Perrott, titled "An RF Pulse Width Modulator for switch mode power amplification of varying envelope signals" published in Proc. Silicon Monolithic Integrated Circuits in RF System Top meeting, pp. 277-280, January 2007 [8], which is incorporated herein by reference. This is in contrast with the normal up-conversion operation of the DPA, which acts as a mixer. As a result, this inaccurate RF output level at the carrier frequency turns out to limit the resolution improvement.

Thus, a need exists for an improved amplitude resolution of an RF-DAC and method therefor.

SUMMARY

Accordingly, the invention seeks to mitigate, alleviate or eliminate one or more of the above mentioned disadvantages singly or in any combination. Aspects of the invention provide an integrated circuit controller, method of controlling an output of a digitally-controlled power amplifier (DPA), and a wireless communication unit as described in the appended claims. These and other aspects of the invention will be apparent from, and elucidated with reference to, the embodiments described hereinafter.

According to a first embodiment of the present invention, an integrated circuit is disclosed. The integrated circuit comprises a digitally-controlled power generation stage and a pulse width modulator (PWM) generator. The digitally-controlled power generation stage is arranged for converting an input signal to a radio frequency (RF) carrier, the digitally-controlled power generation stage comprises a plurality of selectable switching devices capable of adjusting an envelope of the RF carrier. The PWM generator is arranged to generate a PWM control signal according to a fractional word and operably coupleable to the plurality of selectable switching devices of the digitally-controlled power generation stage; wherein the PWM generator inputs the PWM control signal to a subset of the plurality of the selectable switching devices such that a PWM signal adjusts the envelope of the RF carrier output from the digitally-controlled power generation stage.

According to a second embodiment of the present invention, a method of controlling an envelope of a radio frequency (RF) carrier output from a digitally-controlled power generation stage comprising a plurality of selectable switching devices is disclosed. The method comprises: generating a pulse width modulator (PWM) control signal according to a fractional word; selecting a subset of the plurality of selectable switching devices to receive the PWM control signal; and, in response thereto generating a PWM signal to adjust the envelope of the RF carrier output from the digitally-controlled power generation stage.

According to a third embodiment of the present invention, a wireless communication unit is disclosed. The wireless communication unit comprises a digitally-controlled power generation stage and a pulse width modulator (PWM) generator. The digitally-controlled power generation stage is arranged for converting an input signal to a radio frequency (RF) carrier, the digitally-controlled power generation stage comprises a plurality of selectable switching devices capable of adjusting an envelope of the RF carrier. The PWM generator is arranged to generate a PWM control signal according to a fractional word and operably coupleable to the plurality of selectable switching devices of the digitally-controlled power generation stage; wherein the PWM generator inputs the PWM control signal to a subset of the plurality of the selectable switching devices such that a PWM signal adjusts the envelope of the RF carrier output from the digitally-controlled power generation stage.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. Like reference numerals have been included in the respective drawings to ease understanding.

and $\tau = 0.122 \times T$.

Figure 9:
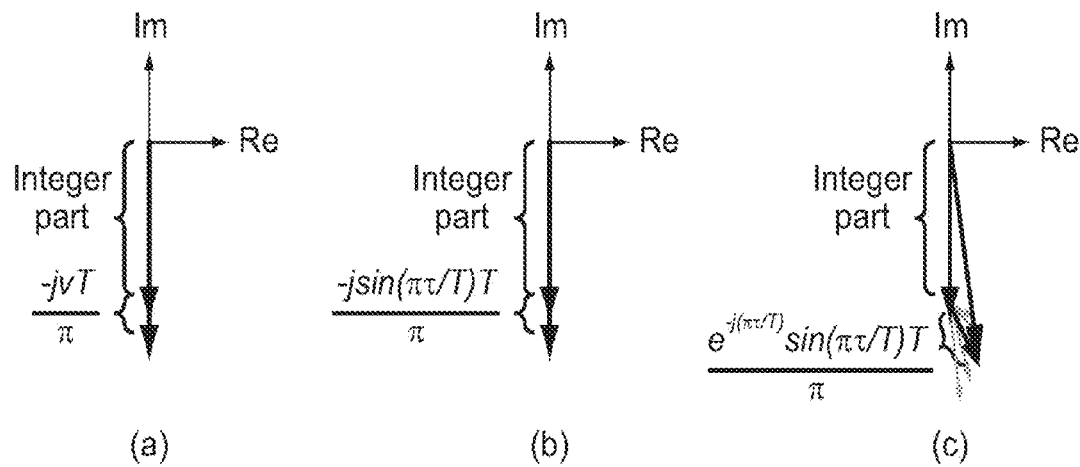

FIG. 9 illustrates a graphical example of (a) Vectors of an integer part of the amplitude signal and a horizontal slicing's fractional part (b) an integer part and a centered PWM's fractional part (c) an integer part and a non-centered PWM's fractional part.

Figure 10:
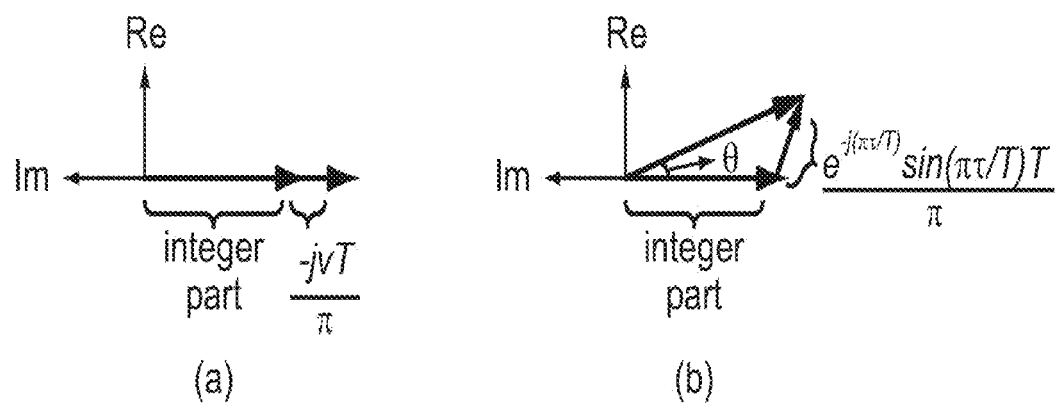

FIG. 10 illustrates a graphical example of (a) Horizontal slicing (b) non-centered PWM in complex plane, where the entire complex plane is rotated 90° counter-clockwise.

Figure 11:
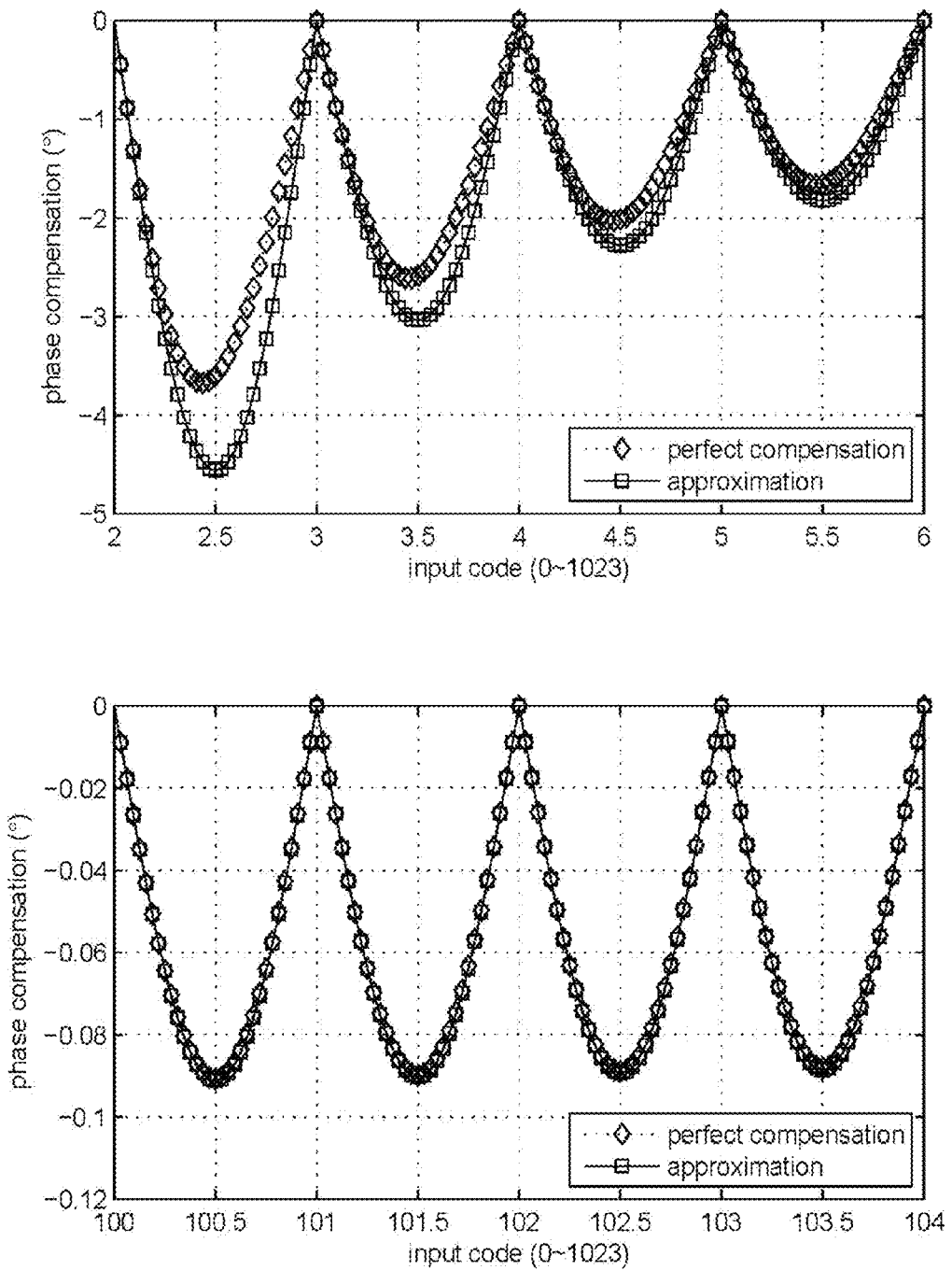

FIG. 11 illustrates a graphical example of a phase compensation comparison between equation (11) and equation (13) given below.

Figure 12:
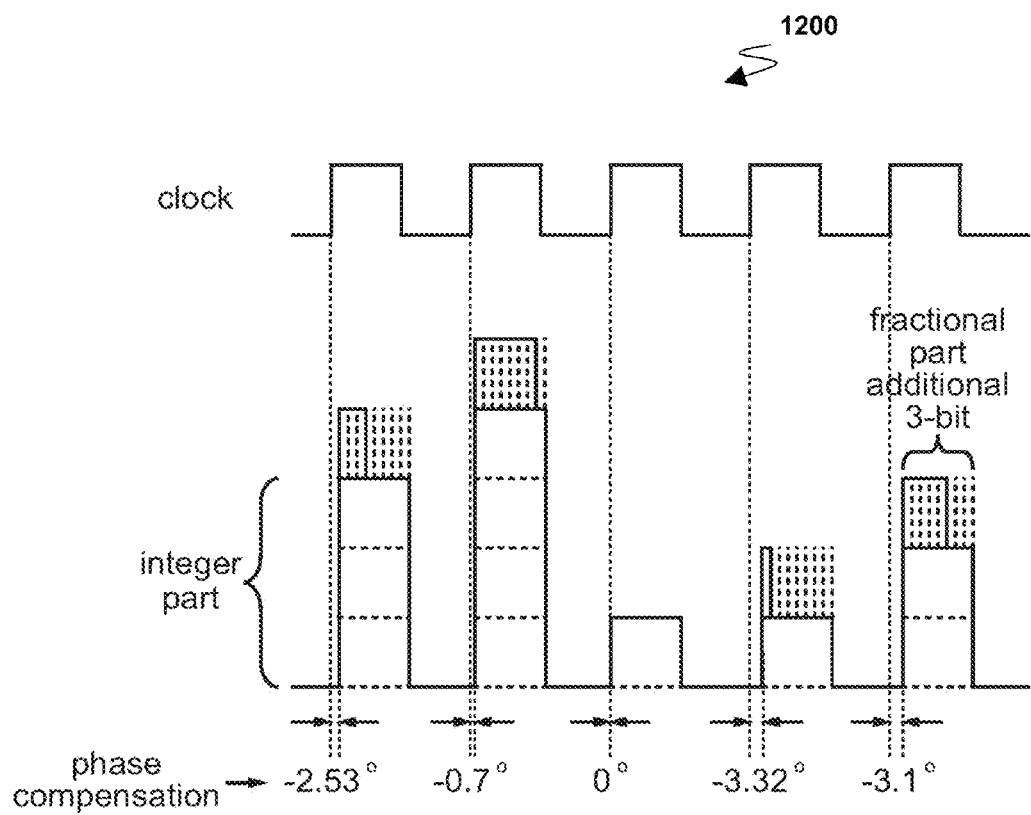

FIG. 12 illustrates a graphical example of timing diagrams of phase compensation for non-centered PWM.

Figure 13:
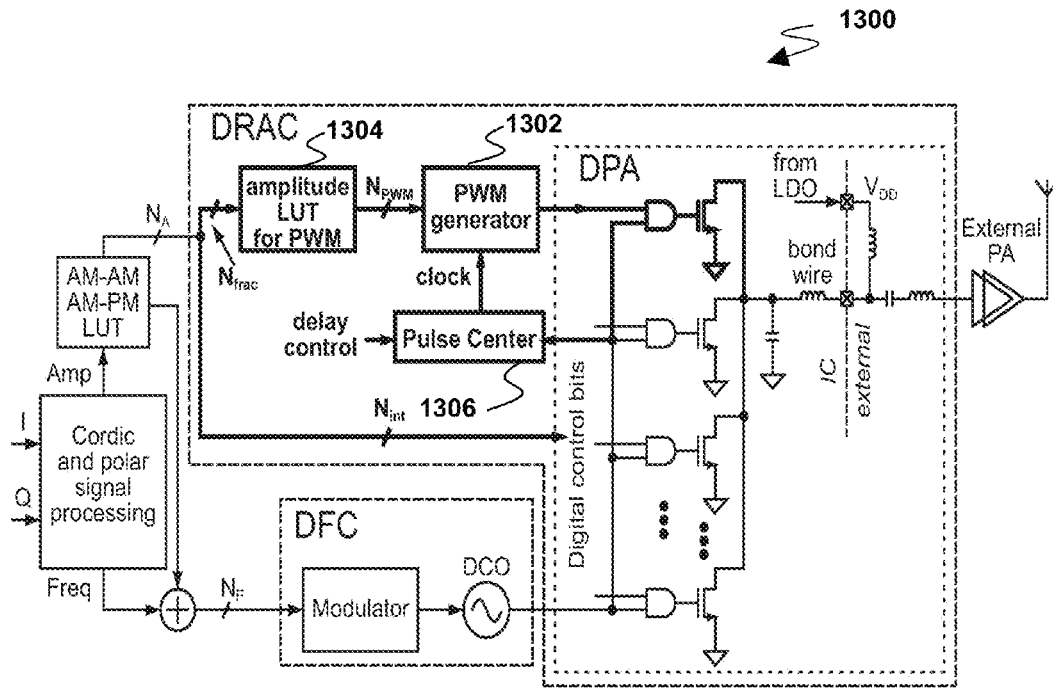

FIG. 13 illustrates an example of a polar transmitter with centered PWM in accordance with some example embodiments of the invention.

Figure 14:
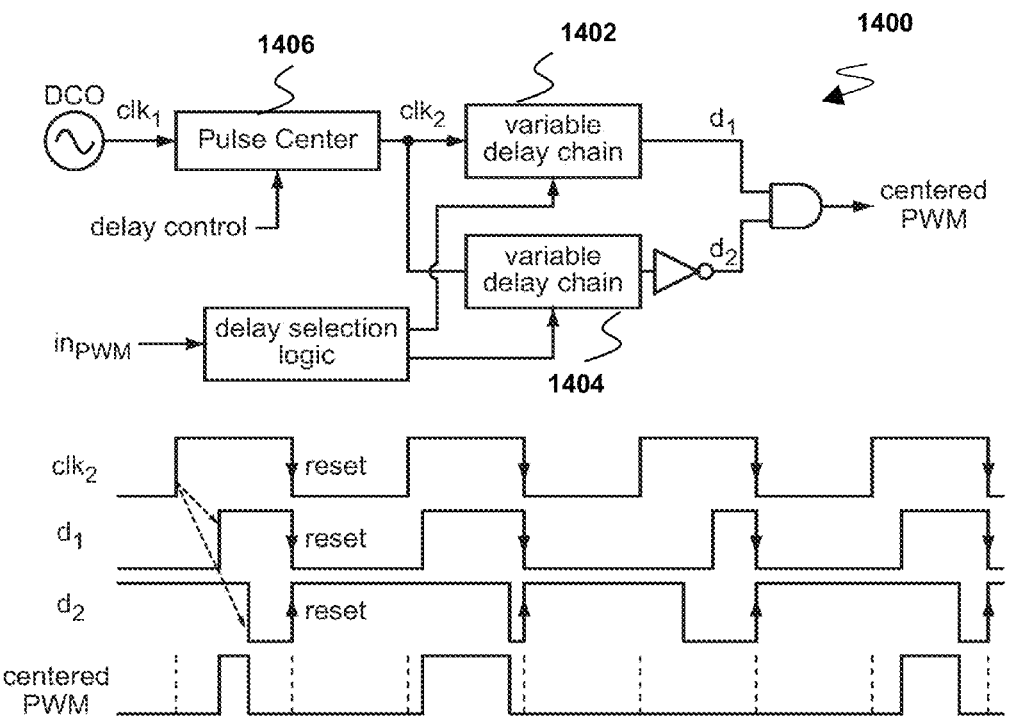

FIG. 14 illustrates an example of a conceptual block diagram of a centered PWM generator and its timing diagram, in accordance with some example embodiments of the invention.

Figure 15:
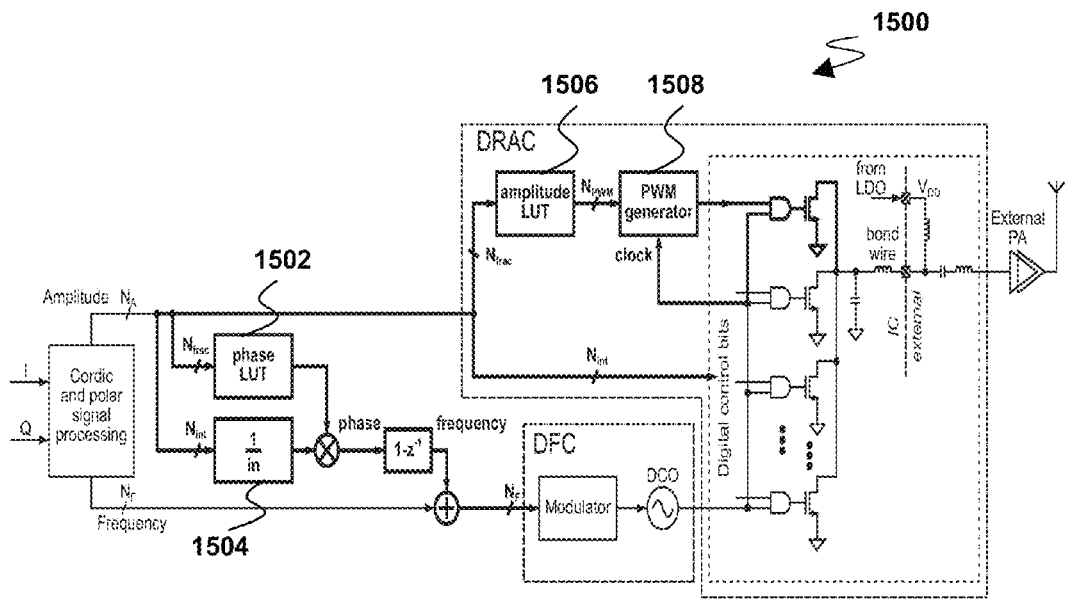

FIG. 15 illustrates an example of a polar transmitter with non-centered PWM, in accordance with some example embodiments of the invention.

Figure 16:
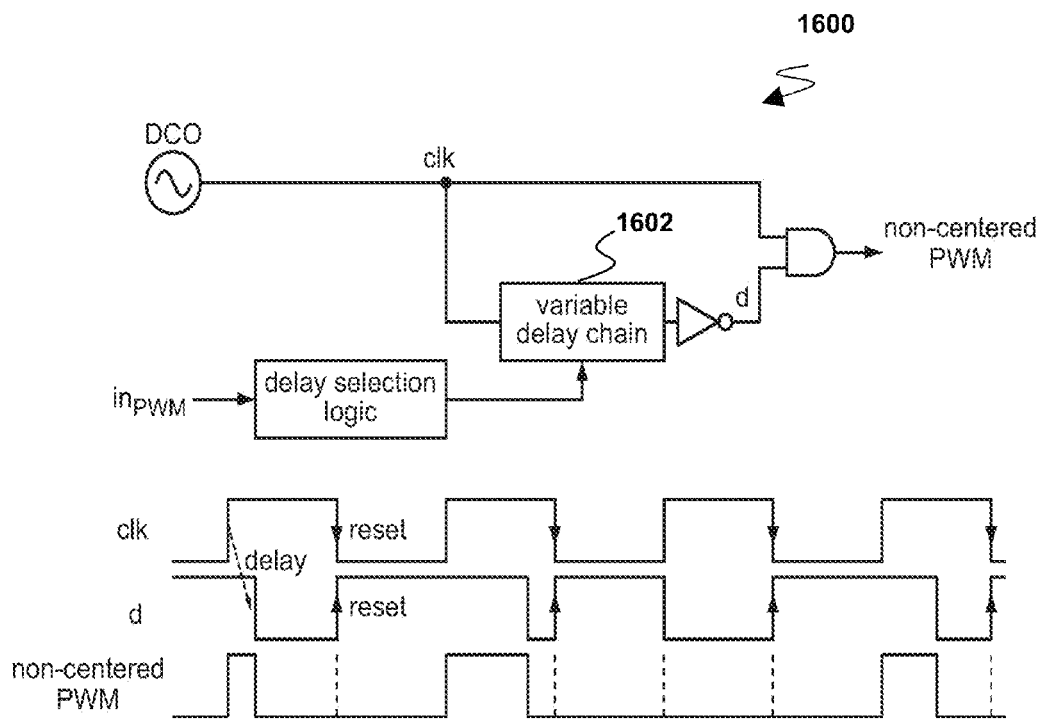

FIG. 16 illustrates an example of a conceptual block diagram of a non-centered PWM generator and its timing diagram, in accordance with some example embodiments of the invention.

Figure 17:
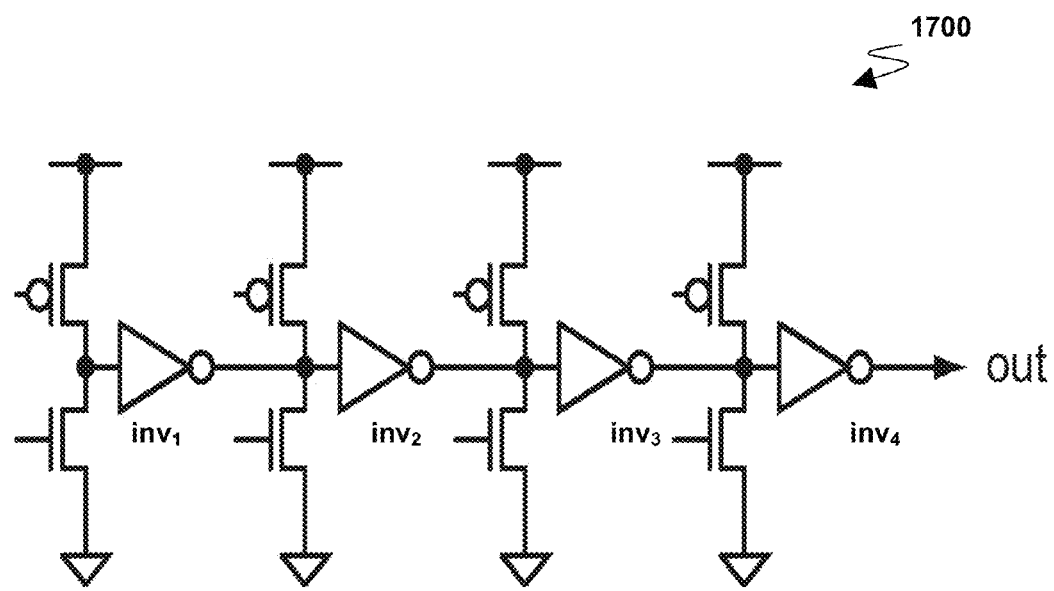
Figure 18:
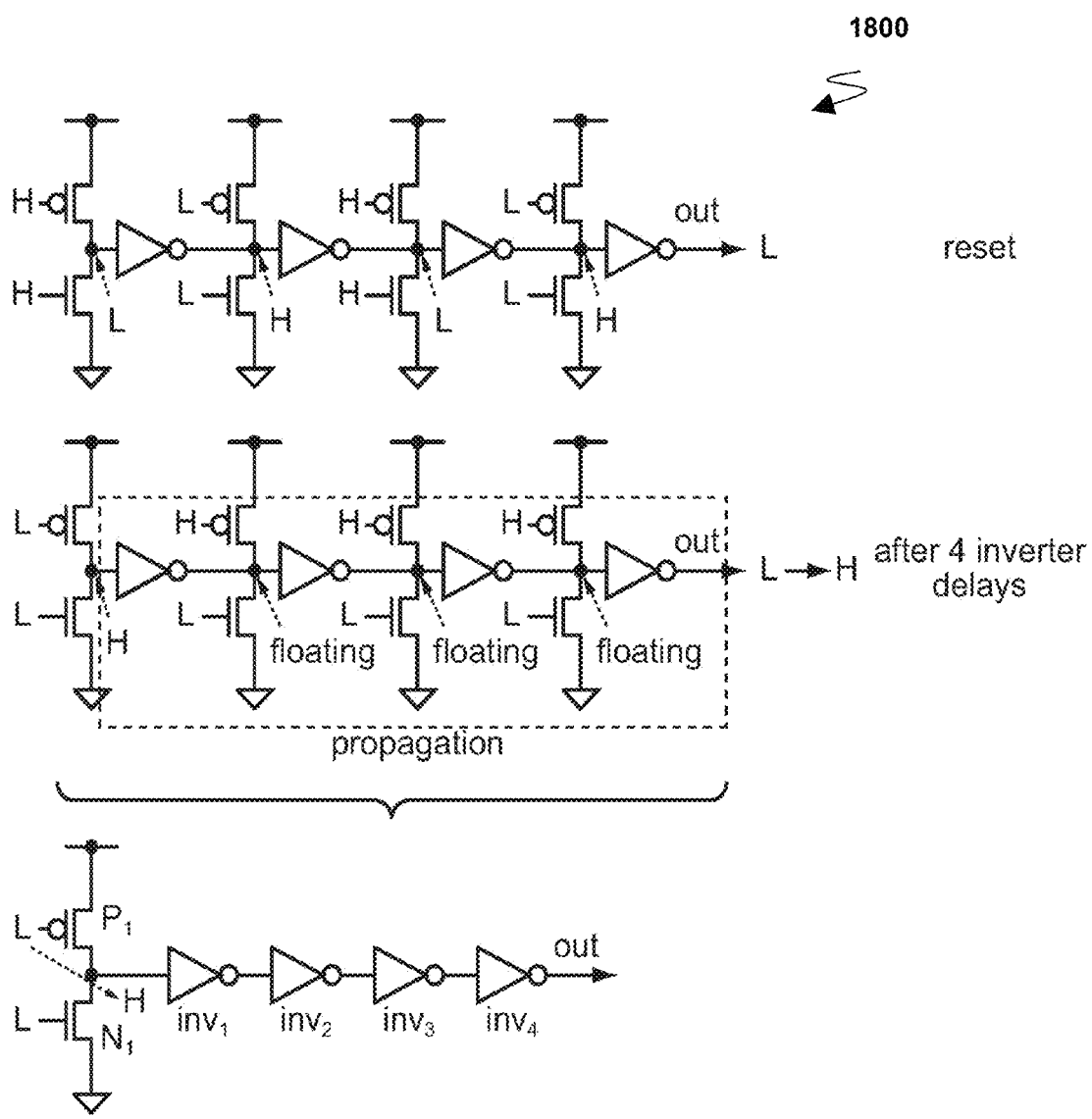

FIG. 17 illustrates an example of a conceptual delay chain for a PWM generator, in accordance with some example embodiments of the invention FIG. 18 illustrates an example of a 4-inverter delay circuit, in accordance with some example embodiments of the invention.

Figure 19:
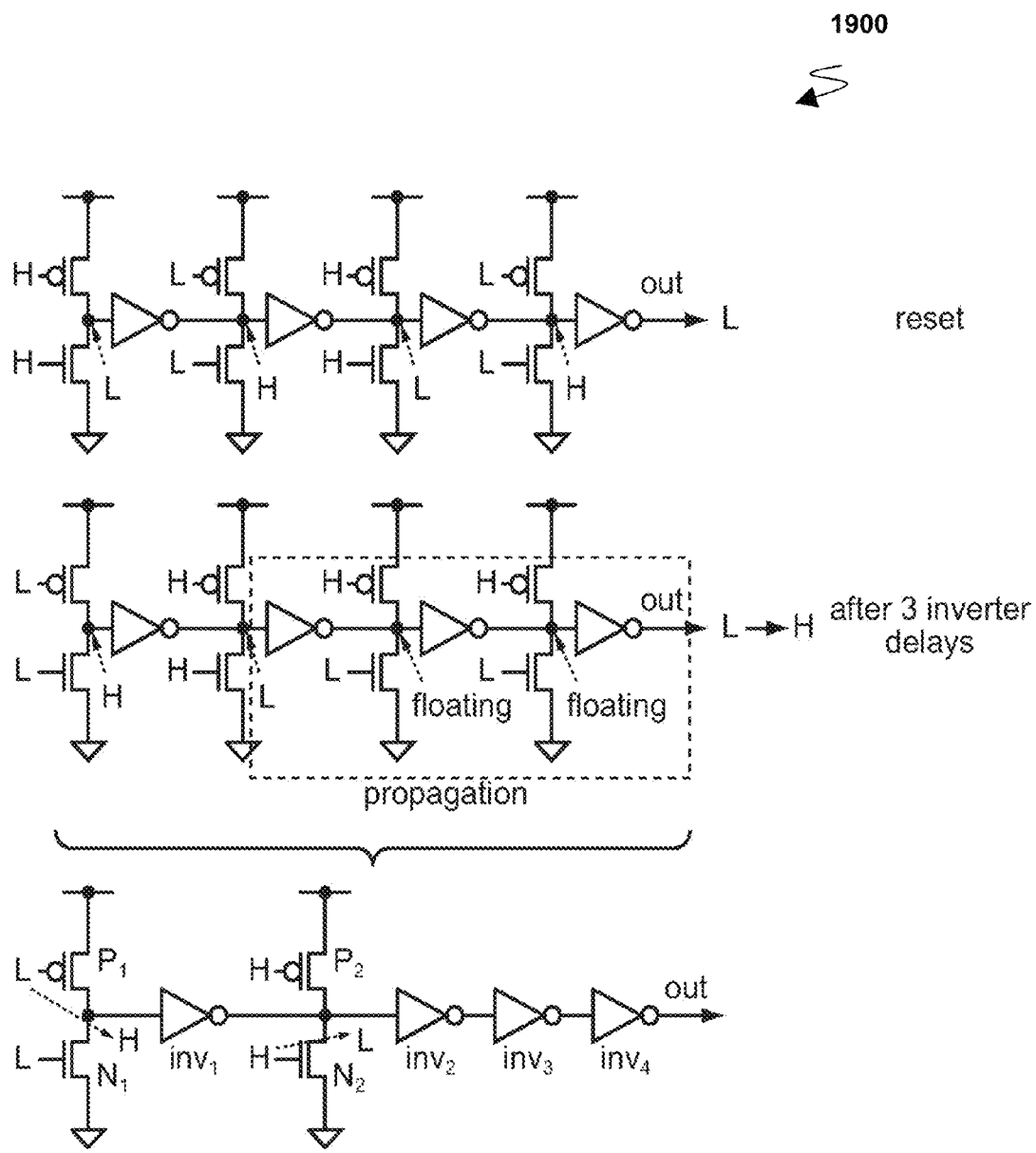

FIG. 19 illustrates an example of a 3-inverter delay circuit, in accordance with some example embodiments of the invention.

Figure 20:
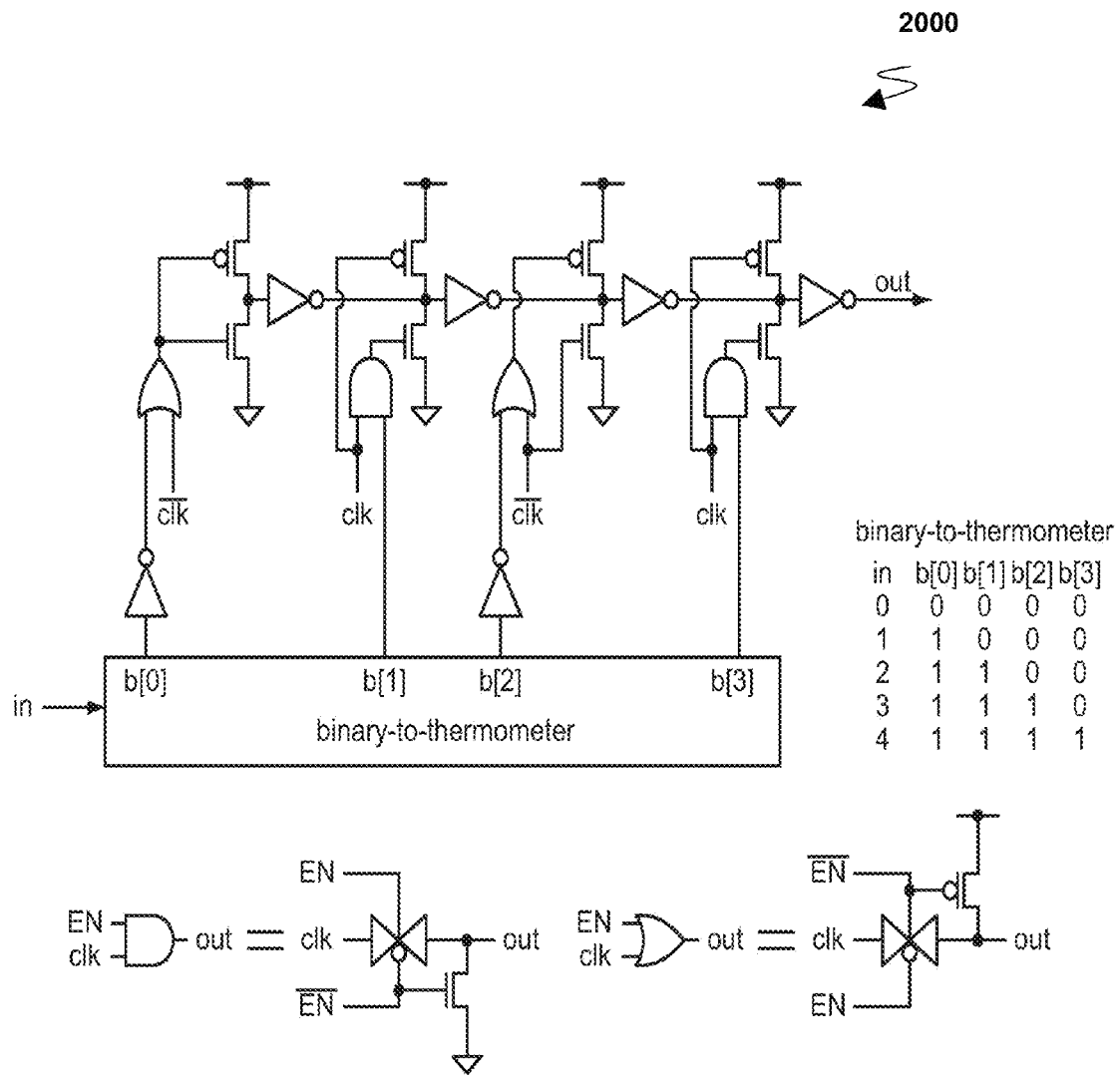

FIG. 20 illustrates an example of delay-chain circuits including control logic, in accordance with some example embodiments of the invention.

Figure 21:
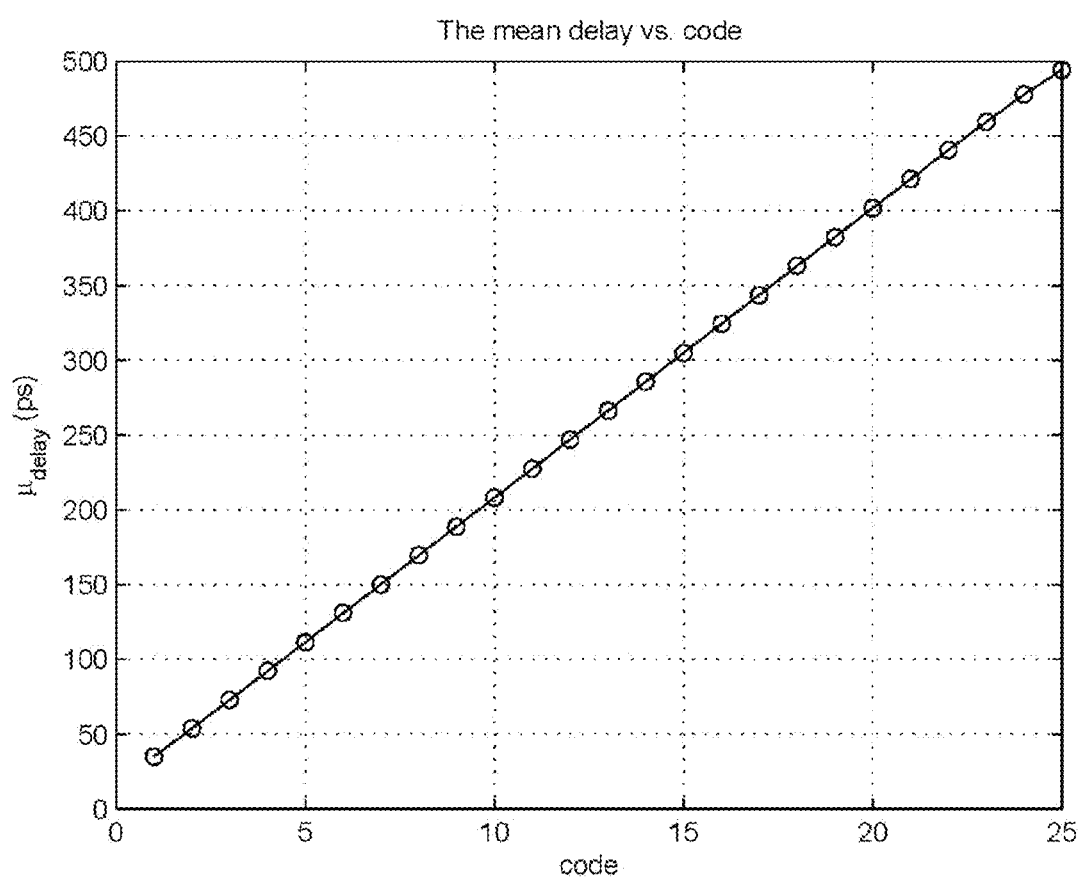

FIG. 21 illustrates a graphical example of a mismatch-averaged propagation (mean) delay versus input code of the circuit of FIG. 20, in accordance with some example embodiments of the invention.

Figure 22:
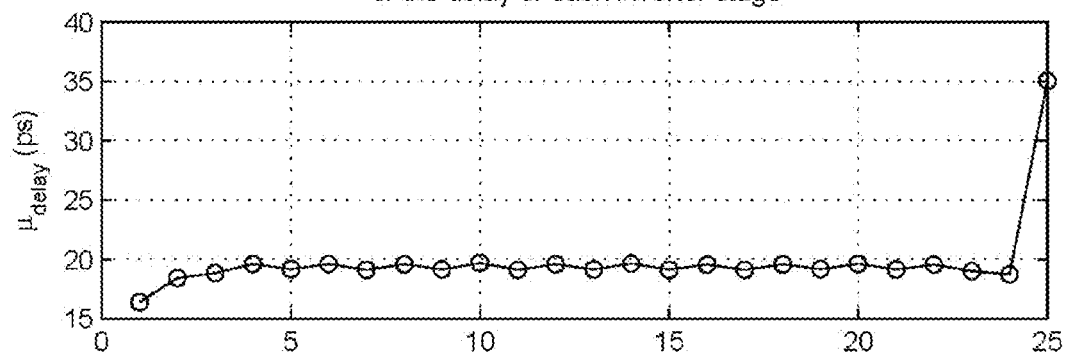
Figure 22:
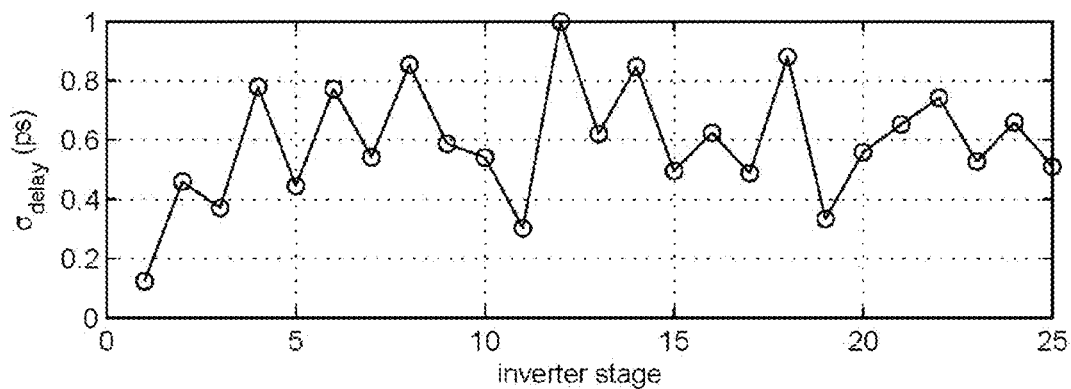

FIG. 22 illustrates an example of mean delays and standard deviations of the inverter stage of FIG. 20, in accordance with some example embodiments of the invention.

Figure 23:
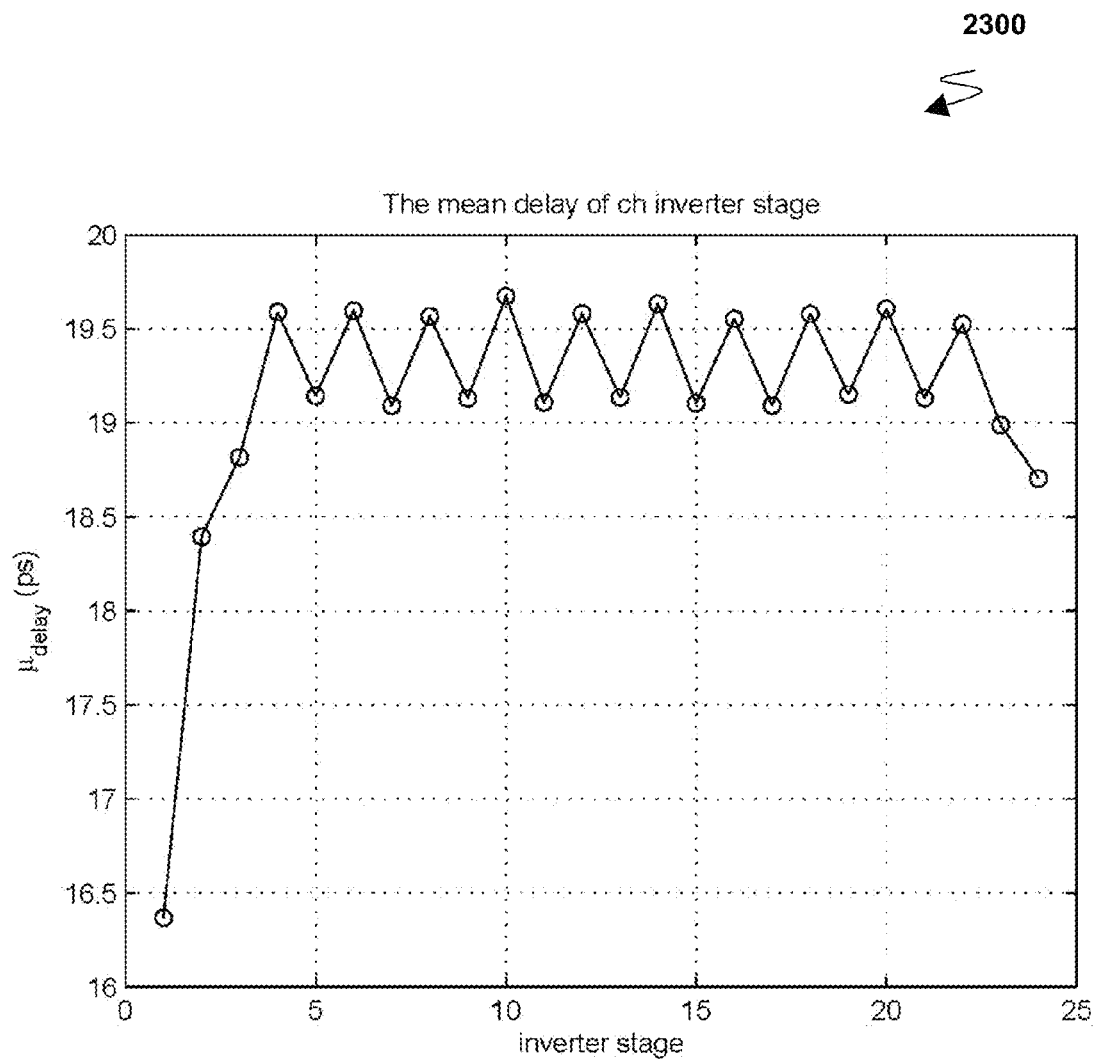

FIG. 23 illustrates an example of a mean delay of each inverter stage of the circuit of FIG. 20, in accordance with some example embodiments of the invention.

Figure 24:
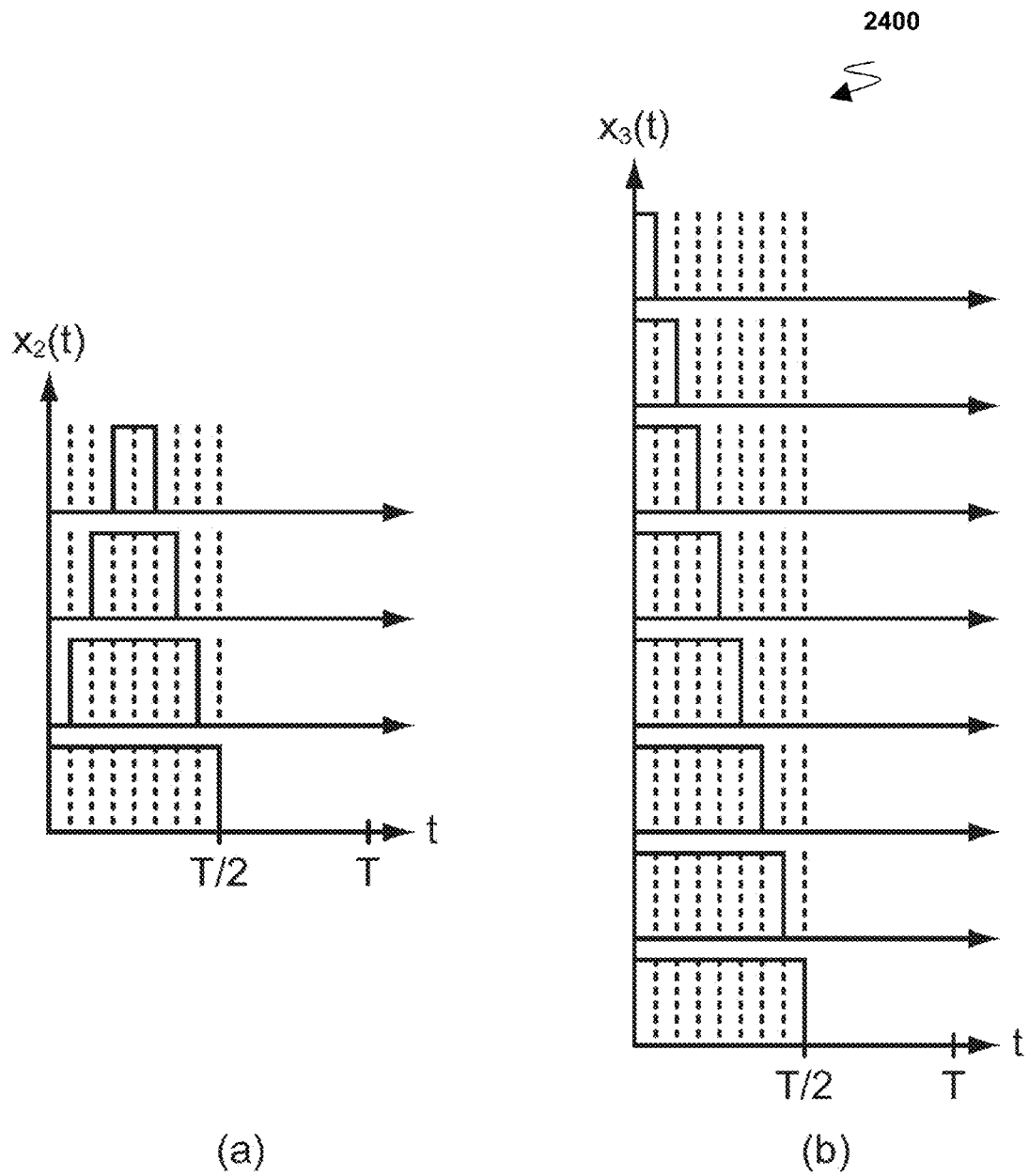

FIG. 24 illustrates a graphical example of a resolution comparison of centered and non-centered PWM generators with a unit delay of $$\frac{1}{8} \times \frac{T}{2}$$

(a) centered PWM (b) non-centered PWM, in accordance with some example embodiments of the invention.

Figure 25:
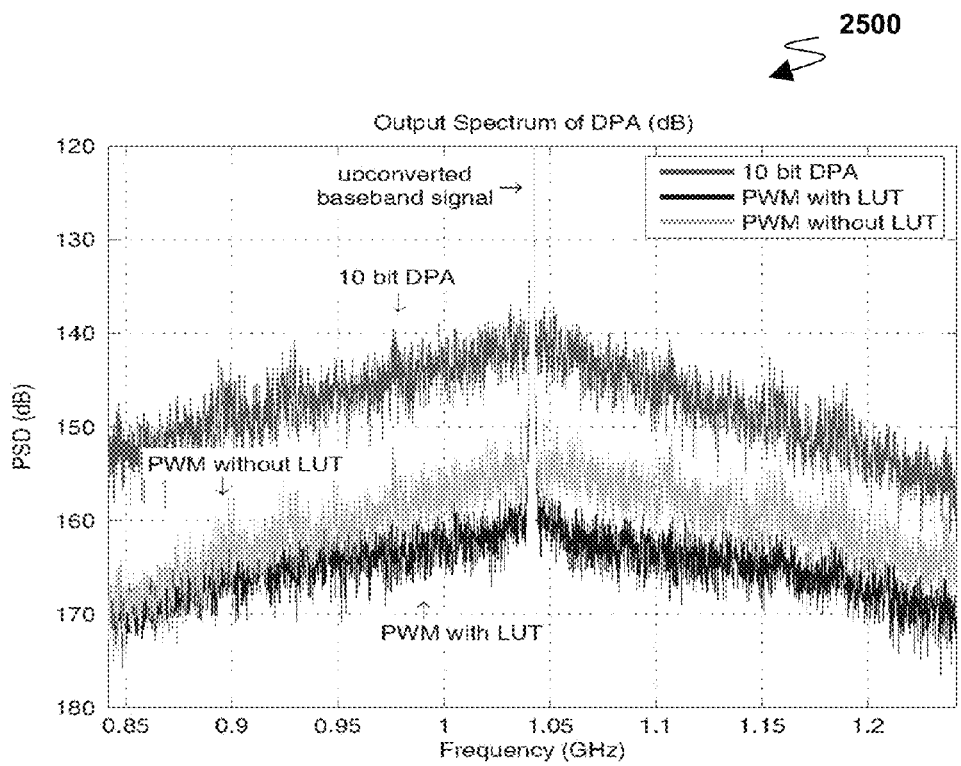

FIG. 25 illustrates an example of an output spectrum of a 10-bit DPA and a DPA with 12-level centered PWM signals with/without the amplitude predistortion LUT, in accordance with some example embodiments of the invention.

Figure 26:
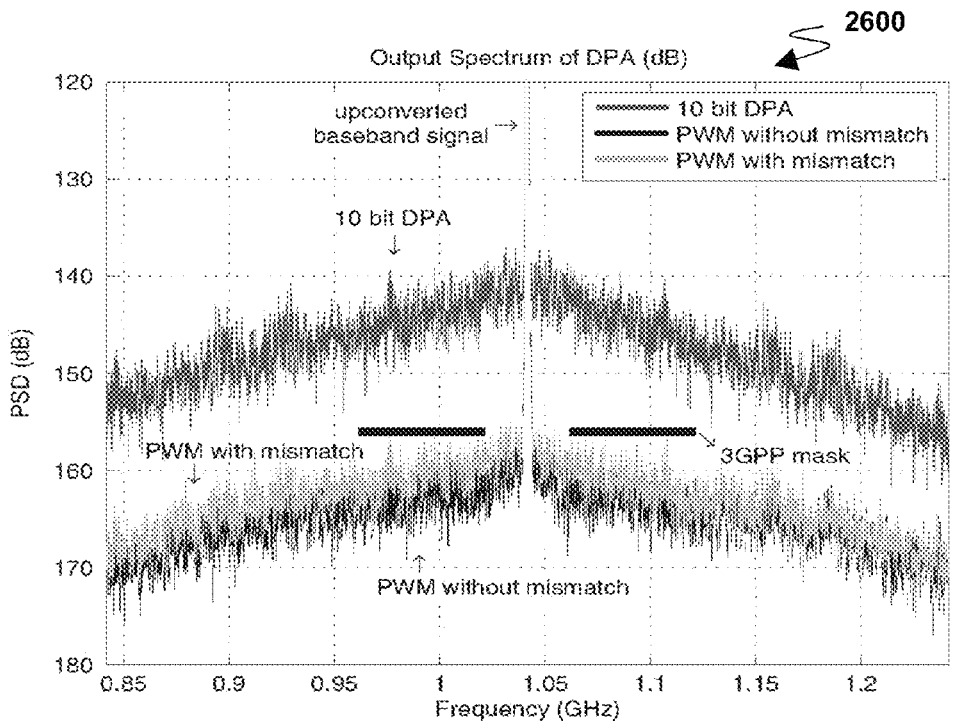

FIG. 26 illustrates an example of an output spectrum of a 10-bit DPA and a DPA with 12-level centered PWM signals with/without delay mismatch, in accordance with some example embodiments of the invention.

Figure 27:
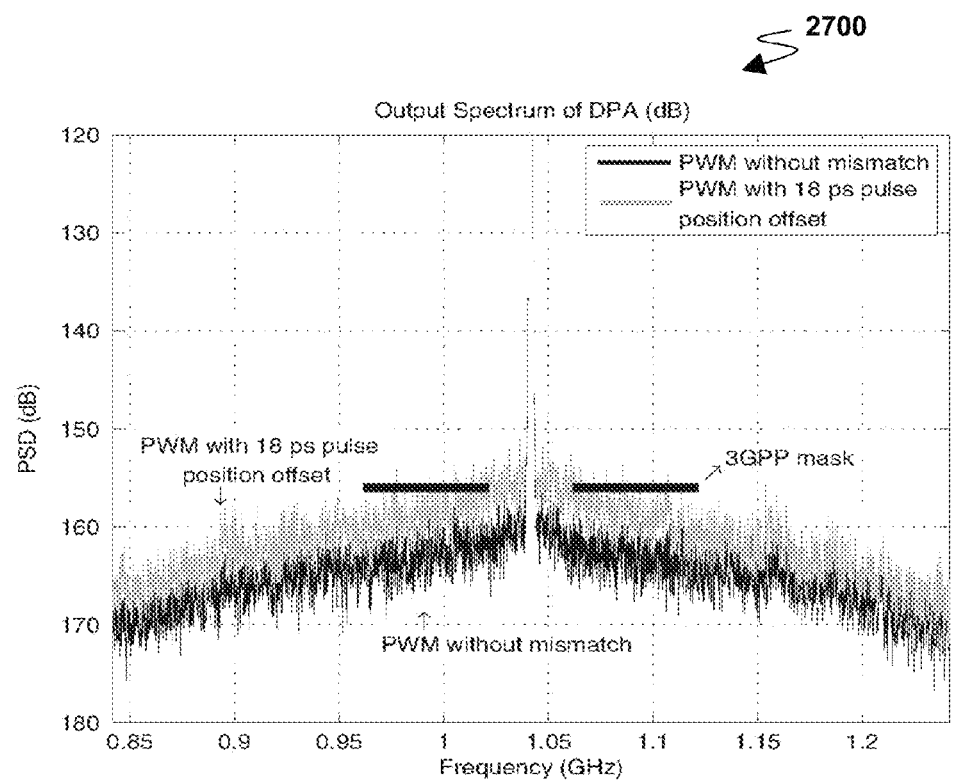
Figure 28:
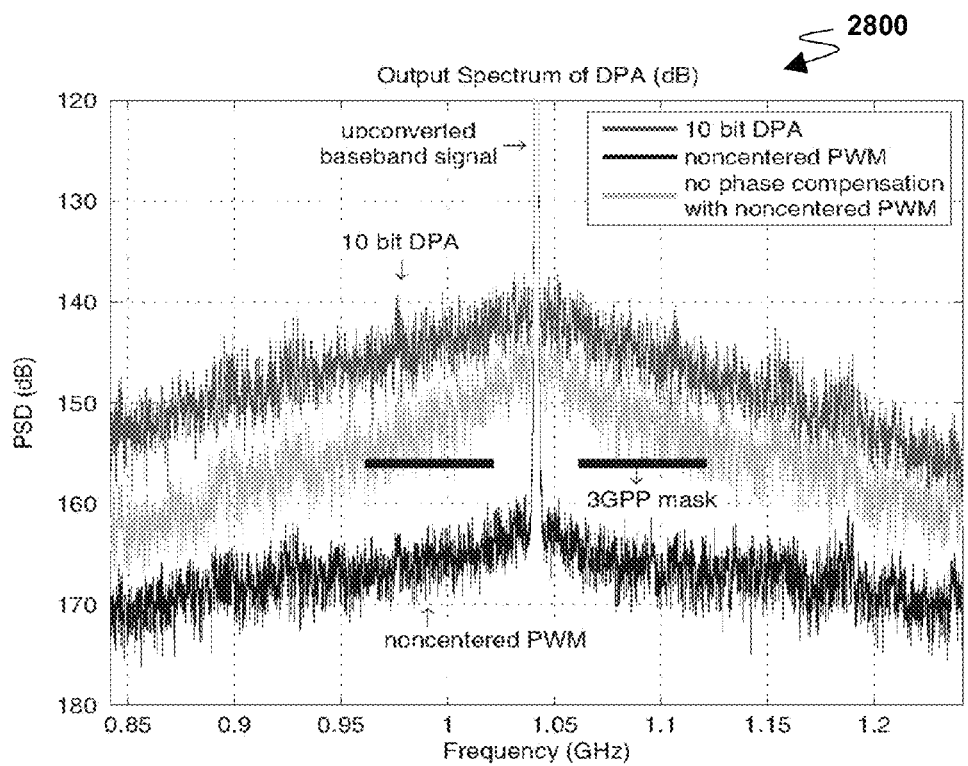

FIG. 27 illustrates an example of an output spectrum of a centered PWM without position offset vs. centered PWM with 18-psec. position offset, where delay mismatch is not considered, in accordance with some example embodiments of the invention FIG. 28 illustrates an example of an output spectrum of a 10-bit DPA and a DPA employing non-centered PWM signals with/without phase compensation, in accordance with some example embodiments of the invention.

Figure 29:
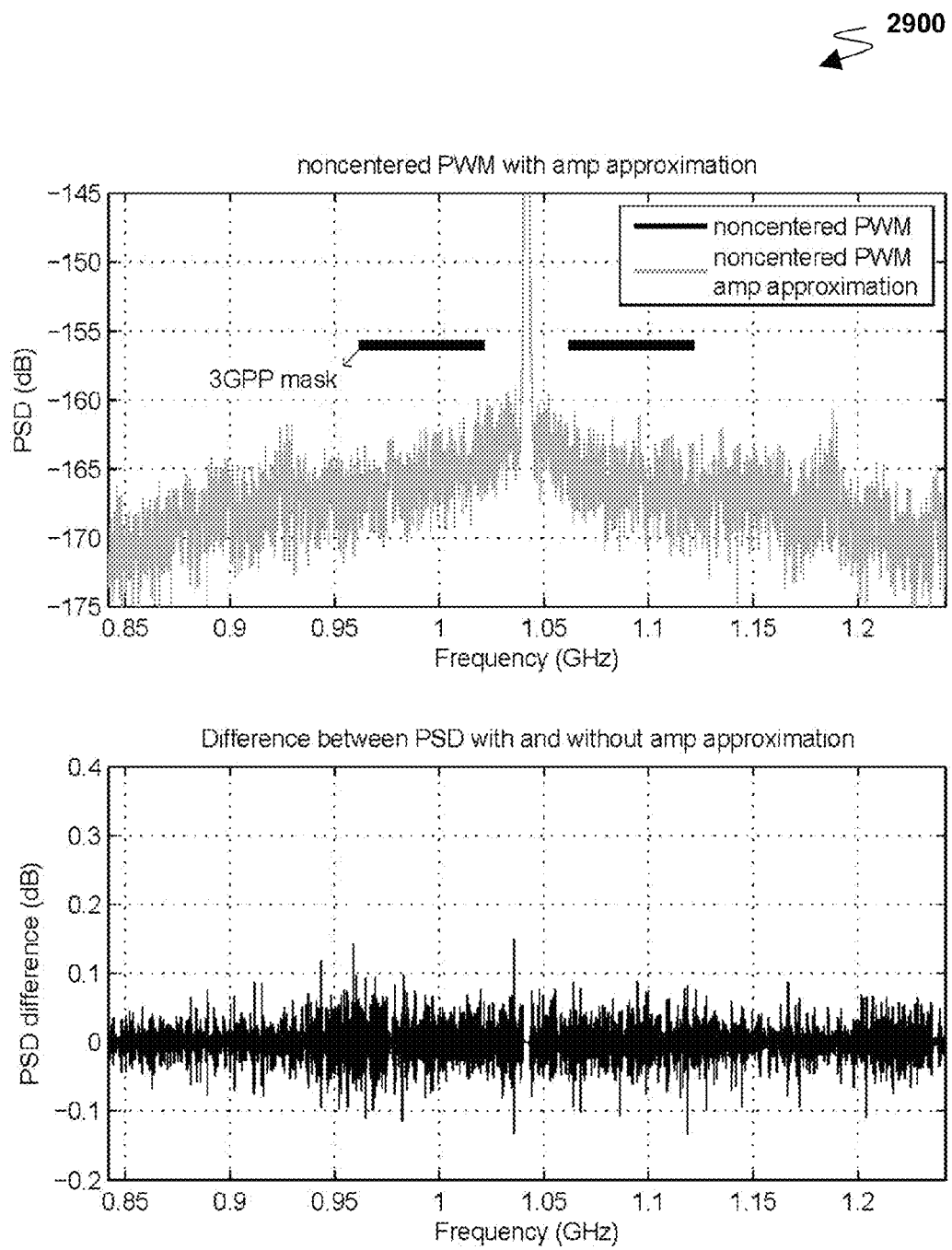
Figure 30:
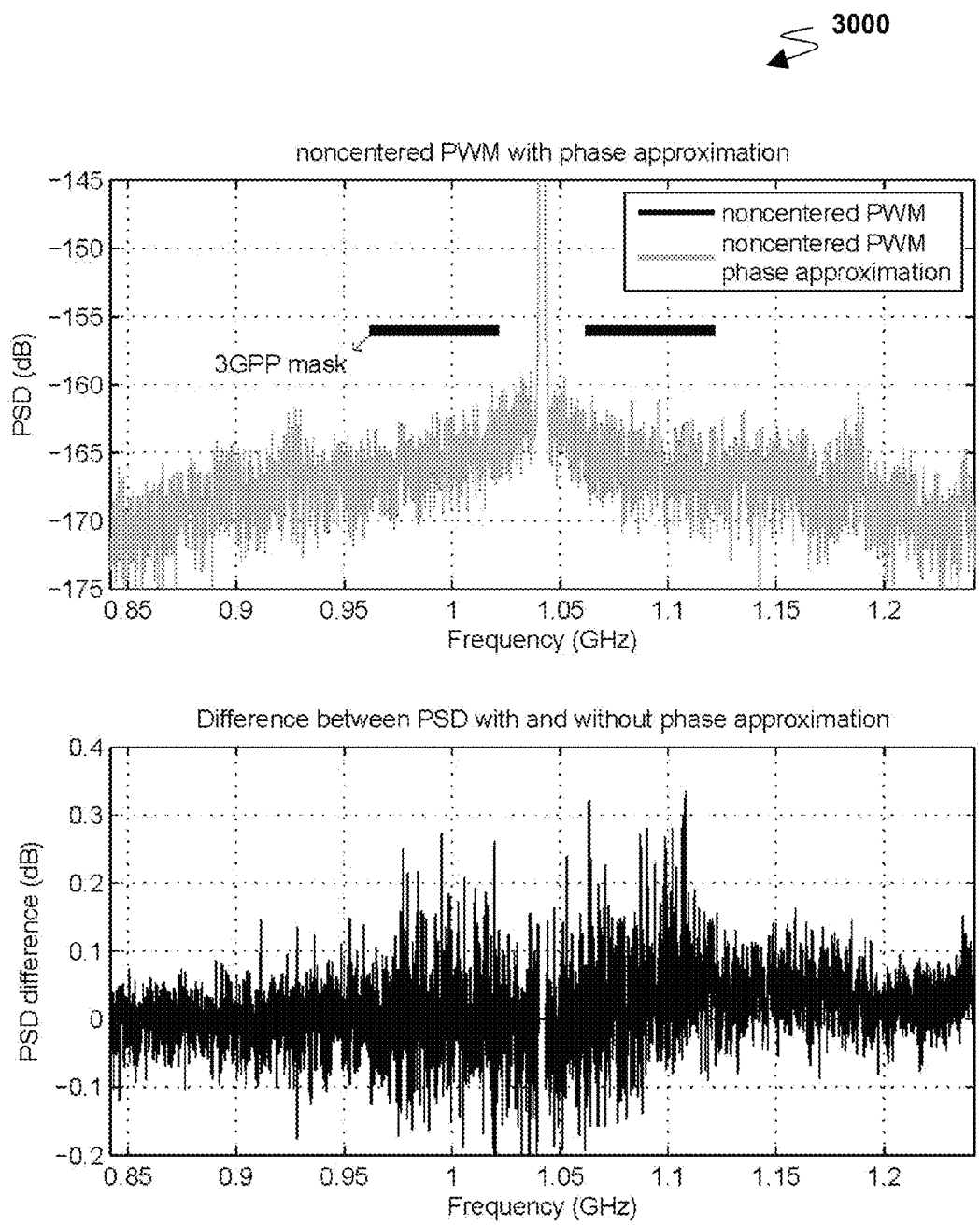
Figure 31:
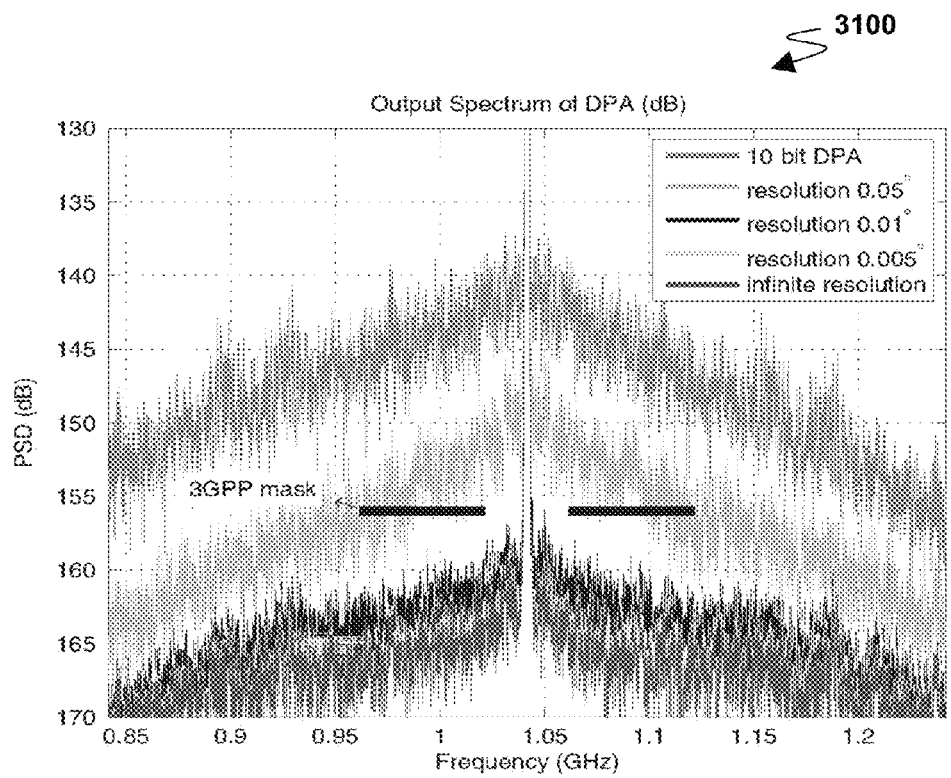

FIG. 29 illustrates an example of an output spectrum of a DPA employing non-centered PWM signals with reduced size of an amplitude predistortion LUT by approximation, in accordance with some example embodiments of the invention FIG. 30 illustrates an example of an output spectrum of a DPA employing non-centered PWM signals with reduced size of a phase predistortion LUT by approximation, in accordance with some example embodiments of the invention FIG. 31 illustrates an example of an output spectrum of a DPA employing non-centered PWM signals with different resolutions of a phase path, in accordance with some example embodiments of the invention.

Figure 32:
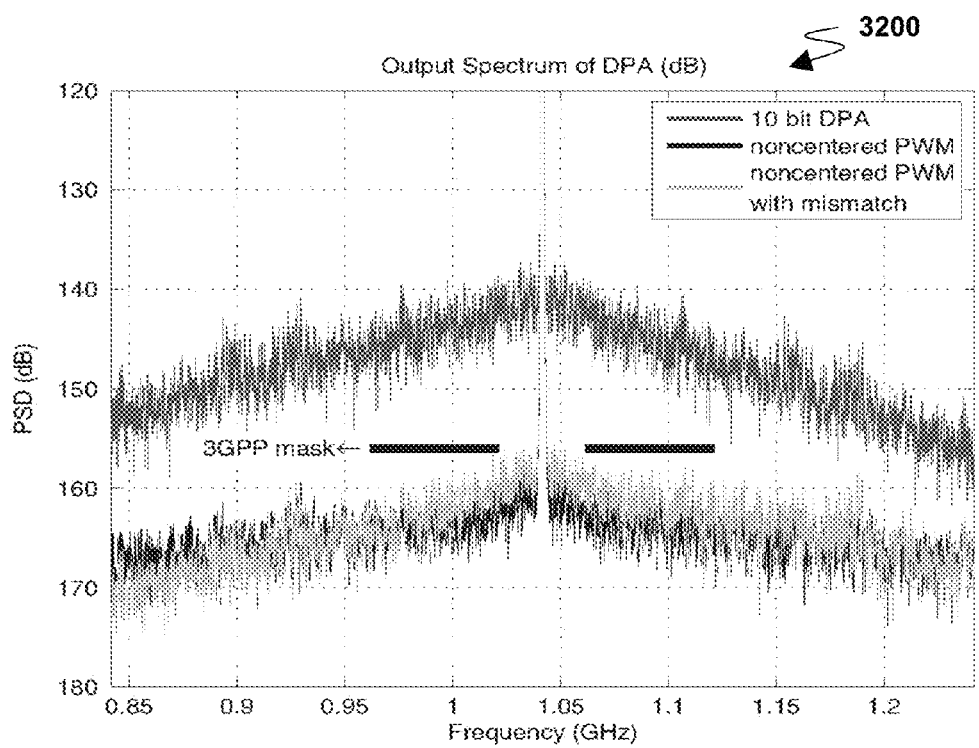

FIG. 32 illustrates an example of an output spectrum of a DPA employing non-centered PWM signals with delay mismatch, in accordance with some example embodiments of the invention.

Figure 33:
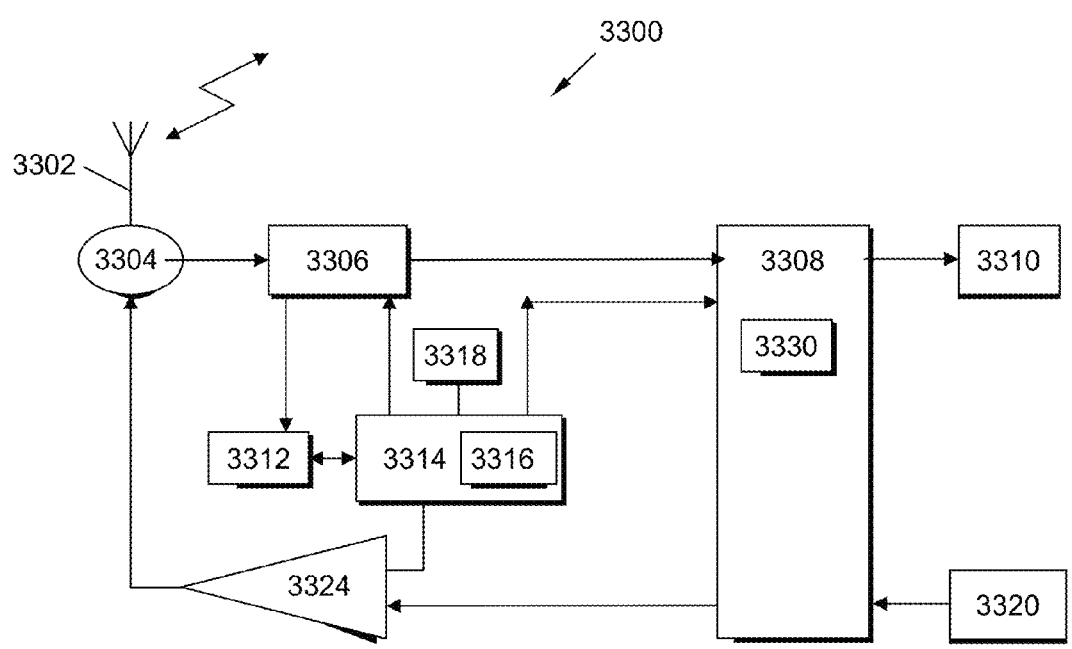

FIG. 33 illustrates an example of a wireless communication unit adapted to employ example embodiments of the invention.

Figure 34:
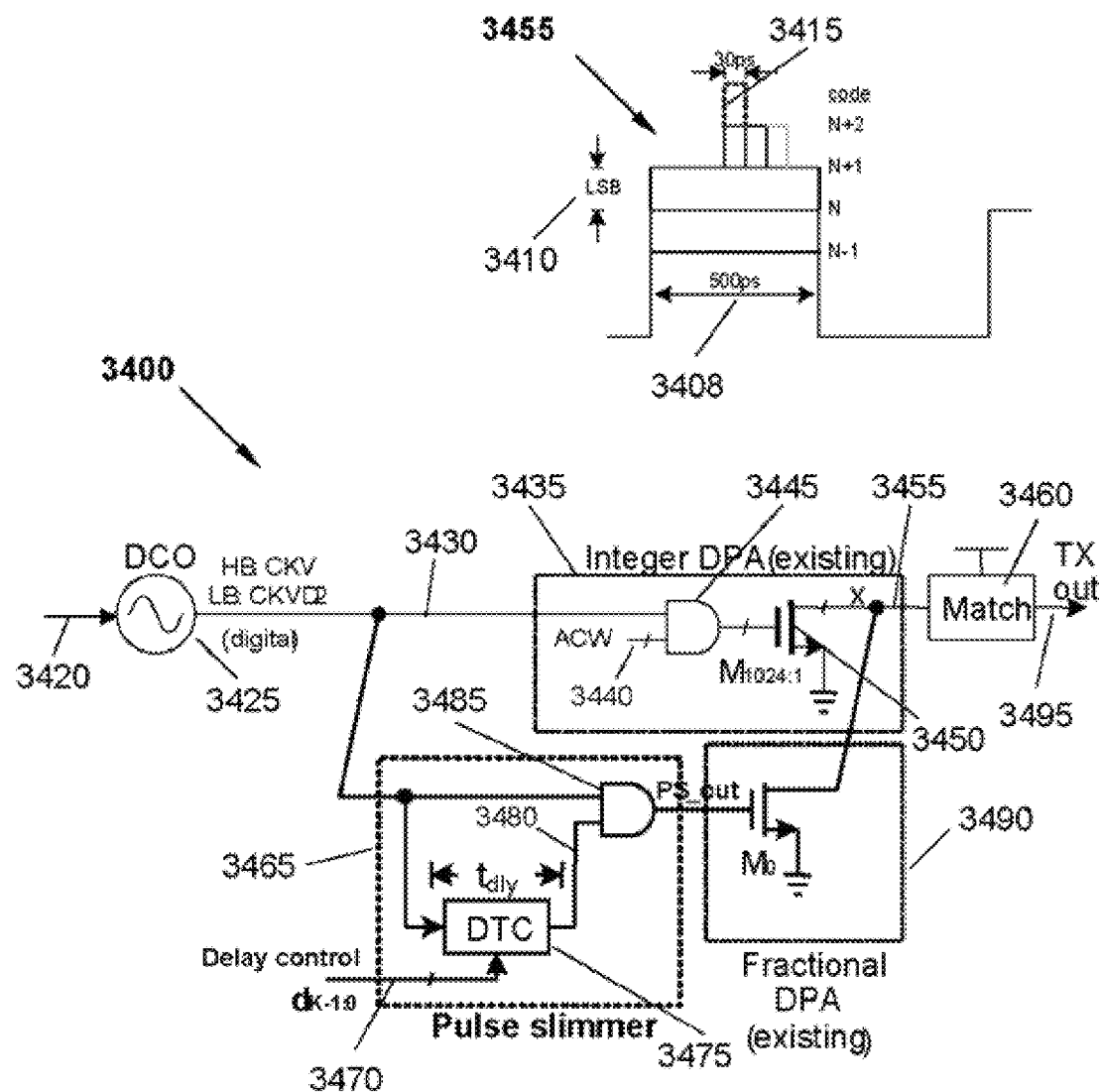

FIG. 34 illustrates an example of a RF-DAC employing PWM according to example embodiments of the invention.

Figure 35:
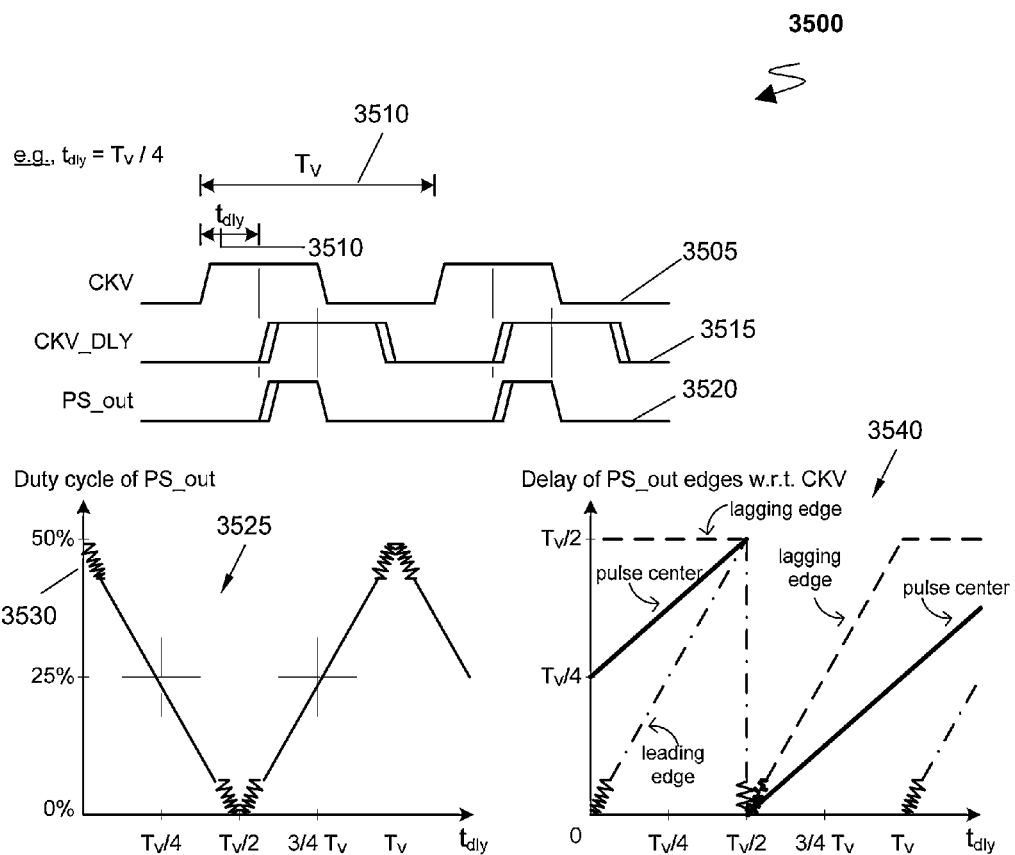

FIG. 35 illustrates timing waveforms of the example RF-DAC employing PWM of FIG. 34 according to example embodiments of the invention.

Figure 36:
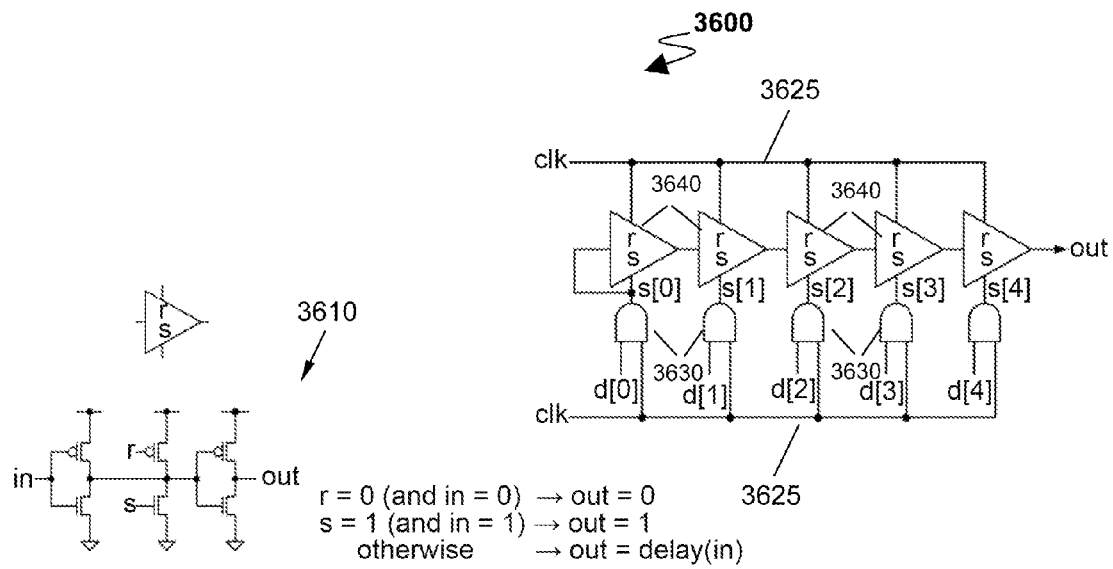

FIG. 36 illustrates an example of a delay cell design, adapted to employ example embodiments of the invention.

Figure 37:
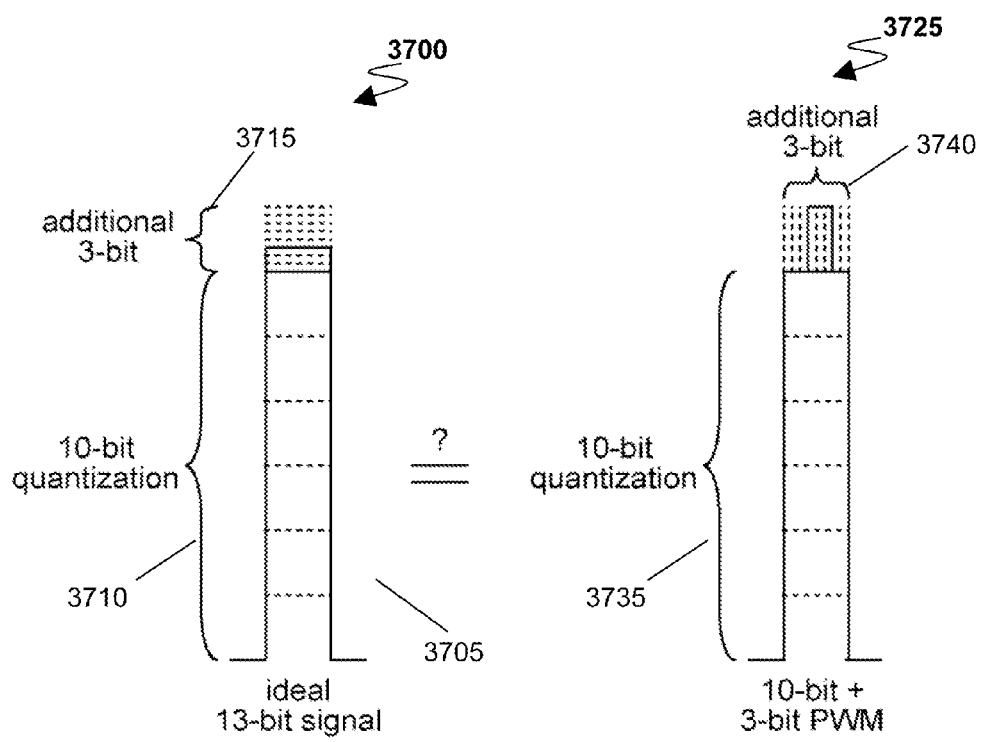

FIG. 37 illustrates a first bit-quantization example of the example RF-DAC employing PWM of FIG. 34 according to example embodiments of the invention.

Figure 38:
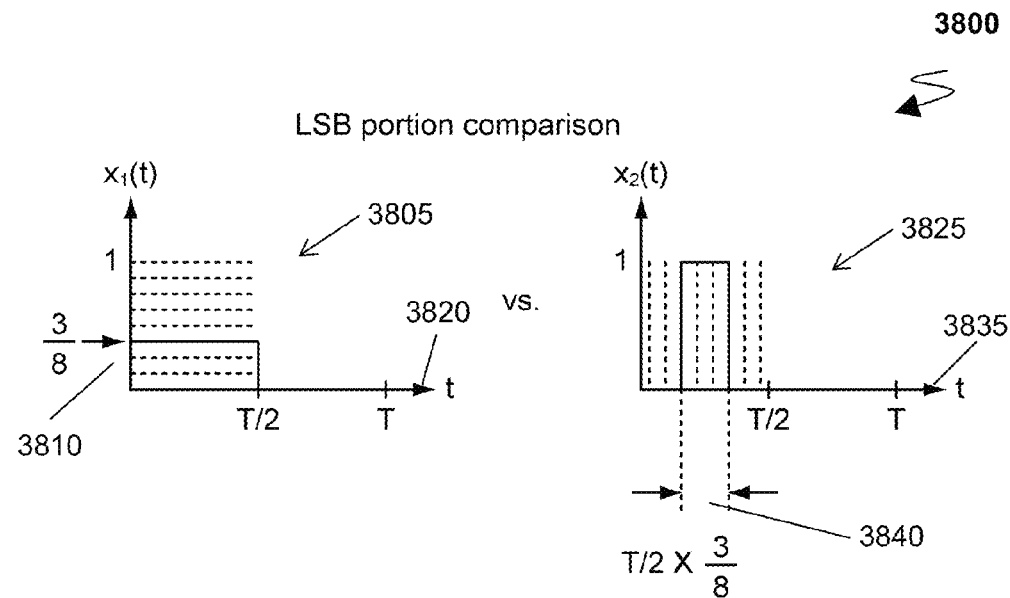
Figure 38:
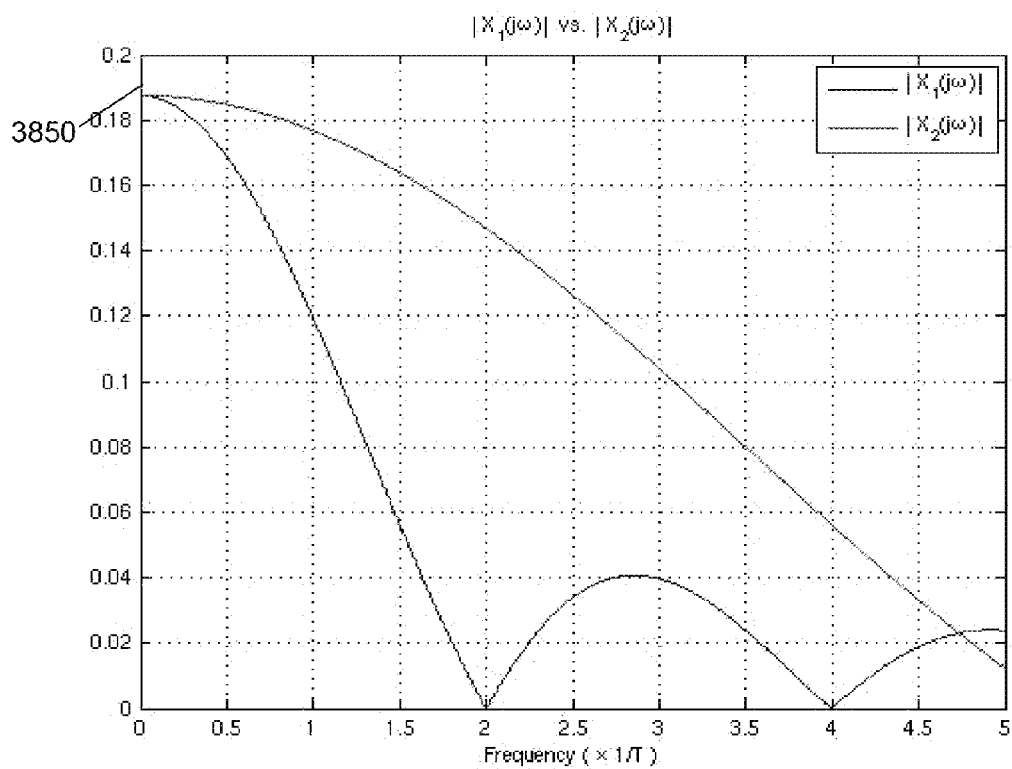

FIG. 38 illustrates graphically a comparison of the two quantization methods to achieve the 3-bit quantization in the bit-quantization example employing PWM of FIG. 34 and FIG. 37 according to example embodiments of the invention.

Figure 39:
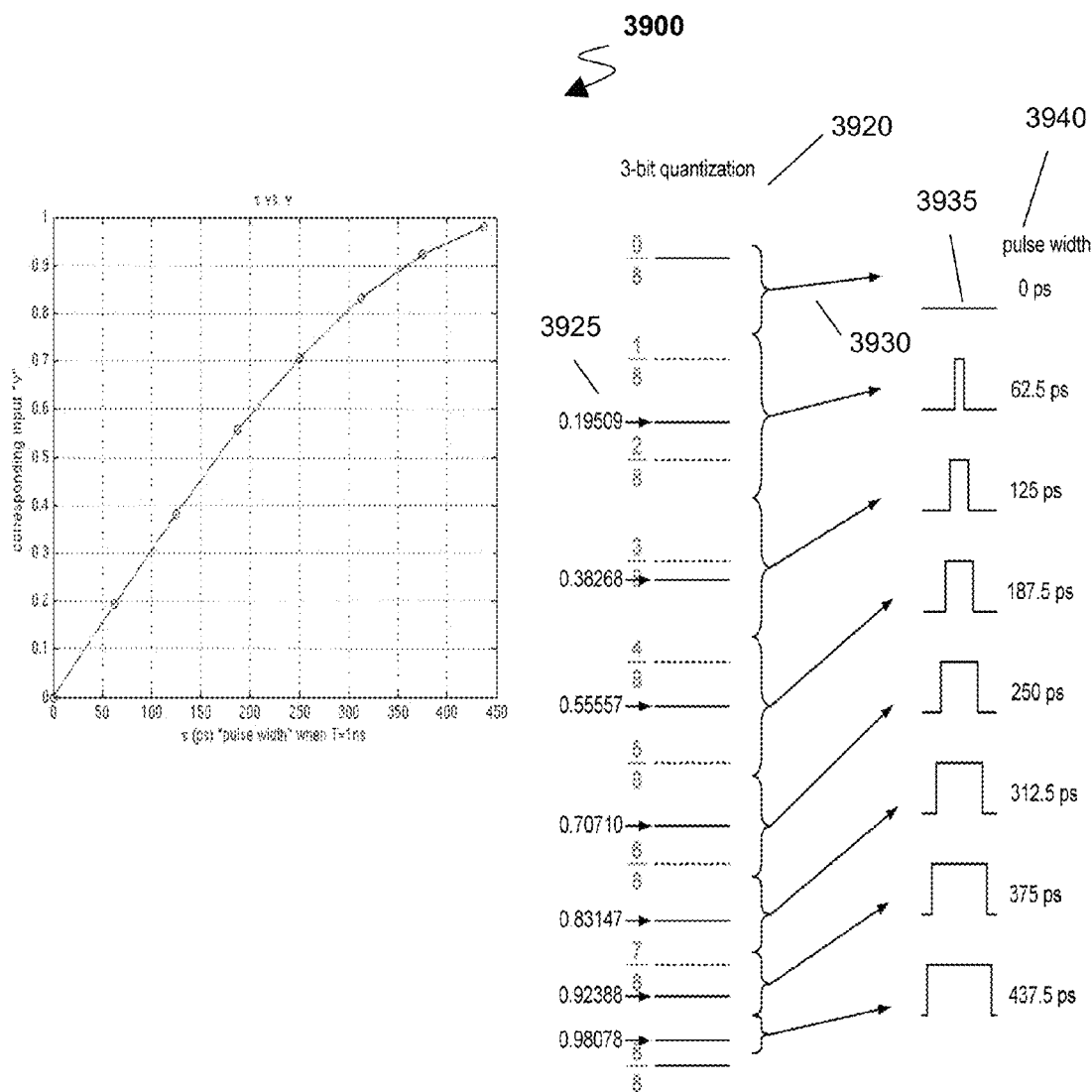

FIG. 39 graphically a bit-quantization example using digital pre-distortion for a PWM pulse width of FIG. 34 according to example embodiments of the invention.

Figure 40:
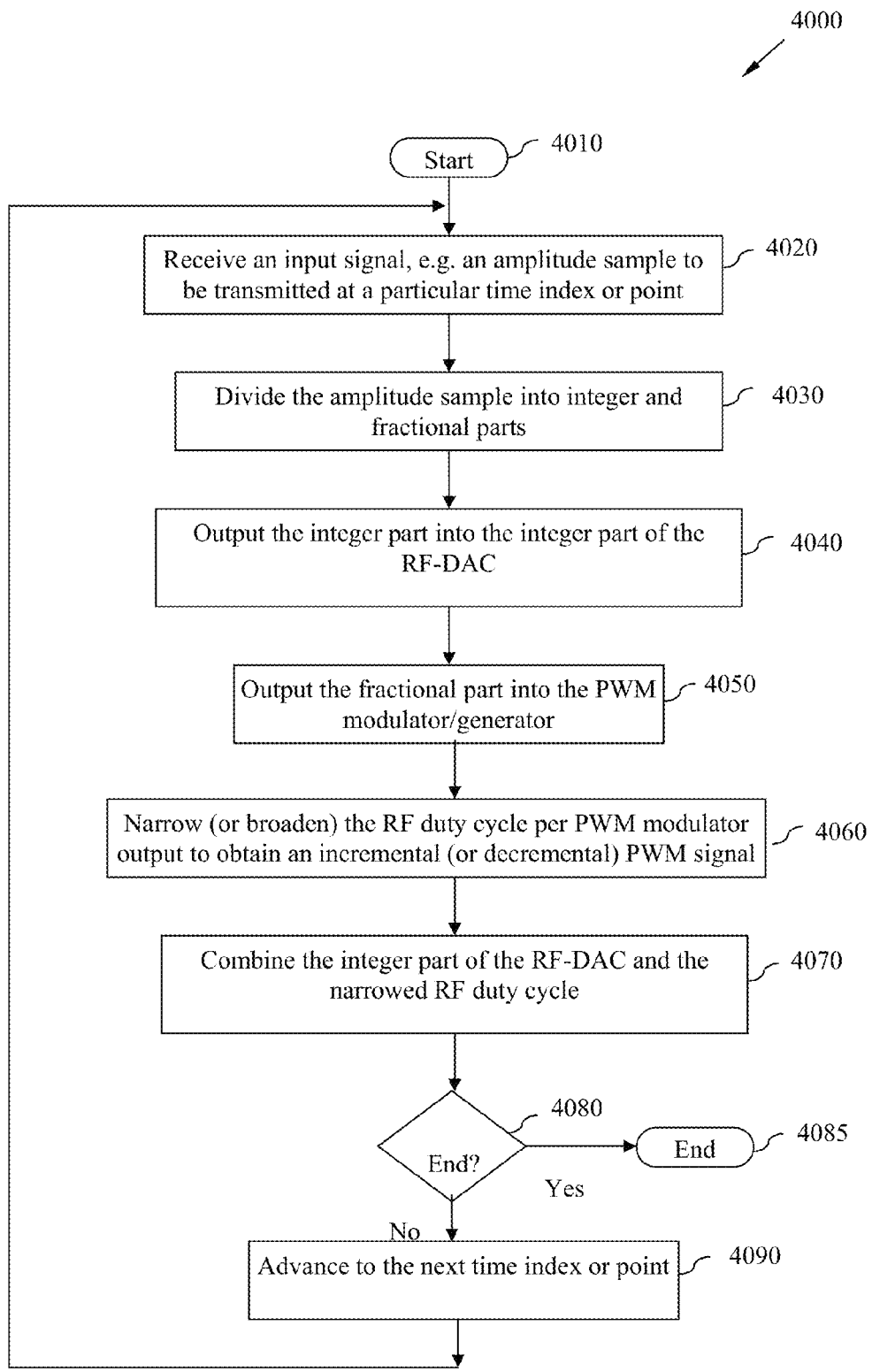

FIG. 40 illustrates a flowchart of an operation of a RF-DAC employing iPWM according to example embodiments of the invention.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Examples of the invention will be described in terms of an integrated circuit (IC) comprising a radio-frequency digital-to-amplitude converter (RF-DAC) employing pulse width modulation (PWM). In examples of the invention, PWM is applied in an incremental fashion. Thus, hereinafter the term incremental PWM (iPWM) may be used to encompass and adjustment to (e.g. increment or decrement) a PWM signal. An RF-DAC is based on a concept of a digitally-controlled power amplifier (DPA). In general, a RF-DAC comprises a number of components, one of which is a power generation stage. Hereinafter, such a power generation stage will be described in the context of a DPA, as this term is widely used in the literature. Notwithstanding the above, in some instances, as these two terms RF-DAC and DPA are closely related, inasmuch as the DPA in some examples may equate to the RF-DAC with other components being provided external to an RF-DAC IC, the two terms may be used henceforth interchangeably. For completeness, it is noted that the term 'DPA' is somewhat of a misnomer, since the DPA input is not an analog RF signal and thus the notion of a 'gain' is incorrect here. Notwithstanding the aforementioned clarification of terms, it will be appreciated by a skilled artisan that the inventive concept herein described may be embodied in any type of RF-DAC design.

Example embodiments of the invention focus on time-domain resolution of a digital signal edge transition, rather than the typical voltage resolution of analog signals, to improve the resolution of RF-DAC performance. Such an approach is particularly beneficial when using a highly-scaled CMOS technology. Examples of the invention will also be described in terms of a digitally controlled power amplifier (DPA) that is used as an RF-DAC and arranged to convert a digital word into amplitude of an RF carrier. In this manner, examples of the invention may benefit from surface acoustic wave (SAW)-less implementations (e.g. designs without a requirement of a transmit bandpass filter connected to the RF output pin). Examples of the invention will also be described in terms of 'EDGE' (sometimes referred to as 2.5G) operation, standardised by the third generation partnership project (3GPP™), which requires 13 bits of amplitude modulation (AM) resolution for flat Q-noise to meet the EDGE wideband noise specification. Using the known technique of applying voltage resolution of analog signals to improve the resolution of RF-DAC performance has been found to be difficult to achieve an AM resolution of >10 bits by means of device matching alone.

Figure 1:
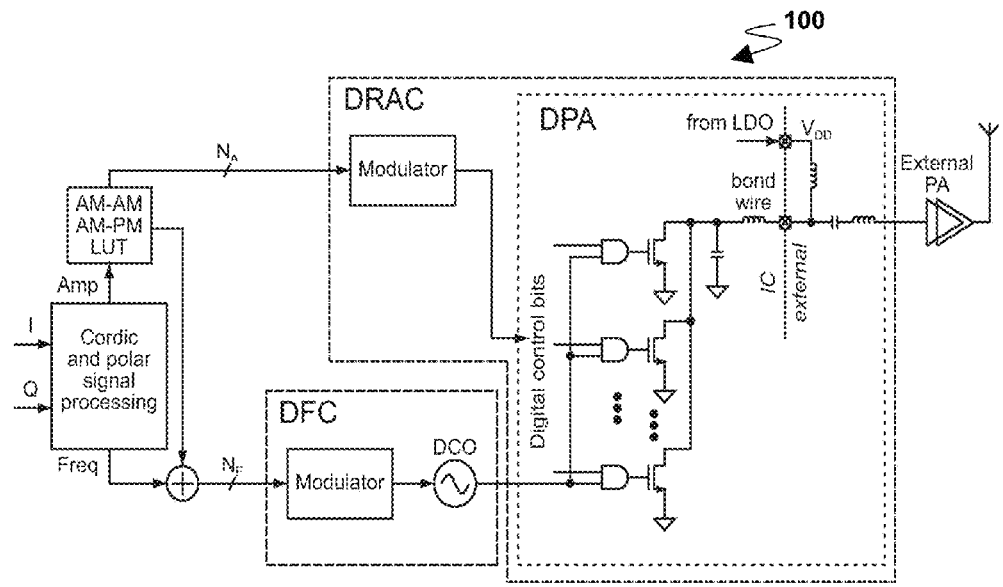
FIG. 1 illustrates a known polar transmitter based on a DCO and DPA circuits from [2].
Figure 2:
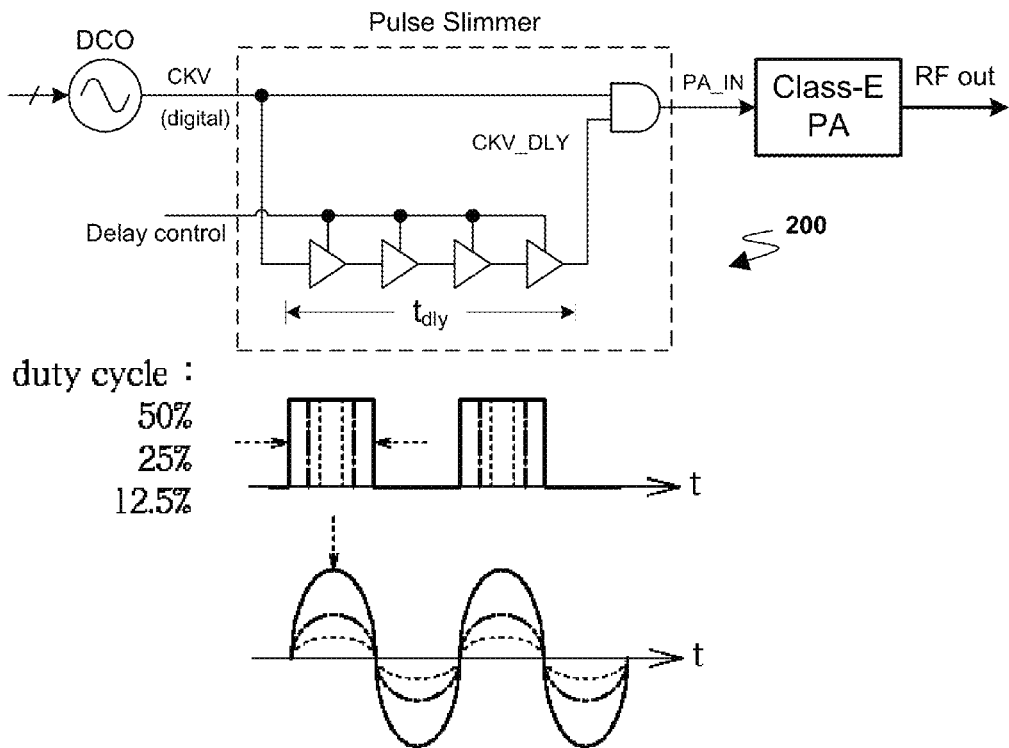
FIG. 2 illustrates a known concept of achieving amplitude modulation through pulse width modulation.

Example embodiments of the invention are described to help mitigate the far-out noise issue and make the digitally-intensive polar architecture of FIG. 1 more attractive to multi-core RF integration, as well as to meet advanced modulation standards. Example embodiments of the invention propose an RF-DAC structure in which significant resolution improvement is achieved by means of incremental pulse width modulation (PWM). PWM is a time-domain operation since the signal is carried in width or duration of a pulse, which is time-domain information. In modern CMOS technology, time-domain processing can achieve higher resolution than voltage/current-domain processing because the switching time improves by device scaling, as described in R. B. Staszewski's Ph.D. thesis from Univ. of Texas, Dallas, USA "Digital deep-submicron CMOS frequency synthesis for RF wireless applications" [5], which is incorporated herein by reference. Although the novel and inventive amplitude resolution improvement is verified with a digital polar transmitter, in example embodiments of the invention, it may be also applied to digitally-intensive I/Q architecture.

In example embodiments of the invention, the PWM may be categorized into centered PWM and non-centered PWM depending on the relative pulse position. The amplitude resolution improvement with centered PWM is presented in [6], which is incorporated herein by reference. Example embodiments of the invention may extend the PWM scheme with non-centered PWM, and compare it with the centered PWM scheme in the context of implementation and performance.

Example embodiments of the invention discuss the details of the PWM scheme to improve the amplitude resolution of the DPA. It will be shown that both centered and non-centered PWM create an incorrect RF signal when the pulse width is chosen in a straightforward way. Predistortion of PWM signals to generate a correct RF signal is then presented. LUT size reduction technique for the non-centered PWM scheme will then follow. Different polar transmitter architectures for centered PWM and non-centered PWM are described, and behavioural simulation results of each PWM scheme are presented to show the benefits of the described methods.

Figure 3:
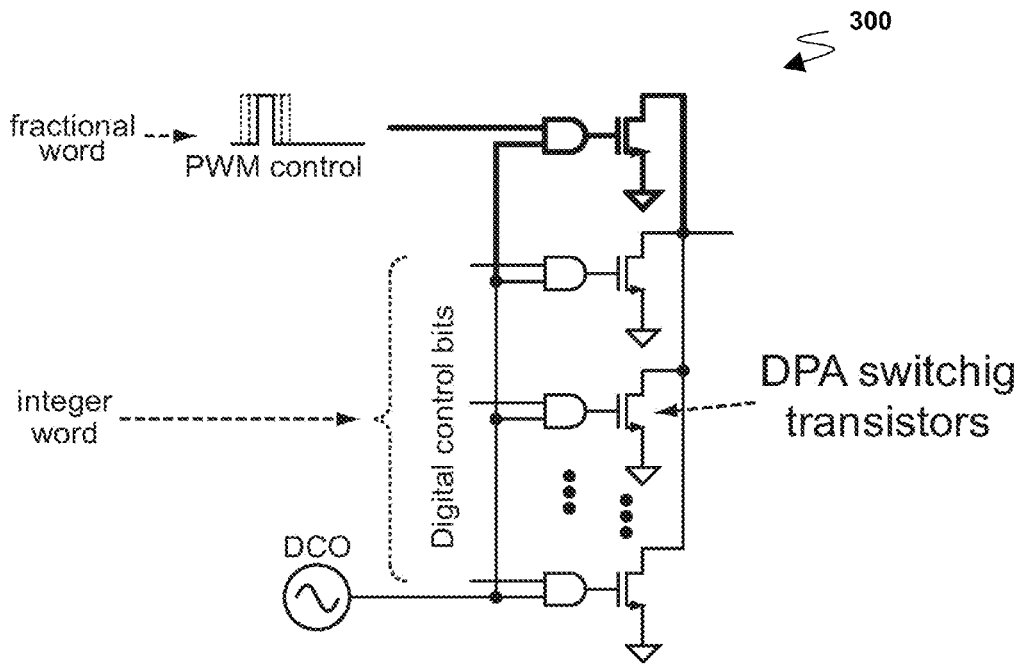
FIG. 3 illustrates an example of amplitude resolution improvement mechanism by incrementally adding a PWM driven transistor.

Example embodiments of the invention describe a DPA that is augmented by at least one additional unit switching device that is driven by a PWM control signal, such that a PWM generator inputs the PWM control signal to a subset of a plurality of selectable switching devices such that a PWM signal adjusts the envelope RF carrier output from the DPA, as shown in FIG. 3. In this context, the term 'adjusts' encompasses adding, substracting, combining, incrementing, decrementing or any other manner to modify the envelope RF carrier output from the DPA with a PWM control signal. However, in some examples, the amplitude resolution of the DPA improves by turning on the added switching device for only a short time interval, for example within the positive half-cycle of the RF period. The RF output amplitude will be controlled by the time interval, and the resolution may be determined by the time precision of the turning-on signal.

Referring now to FIG. 3, an amplitude resolution improvement circuit 300, adding a PWM driven transistor, is illustrated. The amplitude resolution of the DPA in FIG. 3 is now limited by the time resolution of the PWM. In modern CMOS processes, the switching time gets typically improved by 0.7× per technology scaling node; hence, achieving higher resolution in the time-domain is easier than in the voltage/current-domain. In a 65 nm CMOS process, a minimum time resolution of 20 psec is easy to guarantee over process, temperature, and voltage variations.

The switching devices in the original system are controlled by an integer word of the digital amplitude signal. In order to increase the amplitude resolution of the original DPA, a fractional word of the amplitude controls the extra switching device in FIG. 3. Thus, the maximum error that the additional device can cause is less than the quantization noise of the original system. As a result, the added noise or jitter on the PWM signal does not affect the overall performance.

Figure 4:
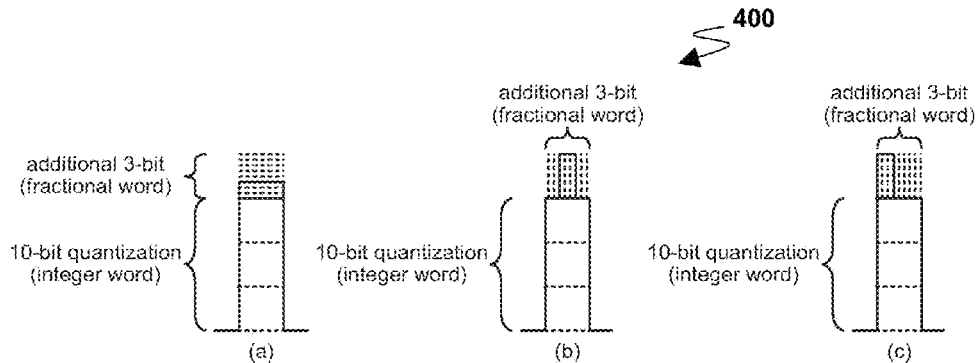
FIG. 4 illustrates an amplitude resolution improvement mechanism by first (a) horizontal slicing, (b) vertical slicing with centered PWM, (c) vertical slicing with non-centered PWM and secondly by (d) the fractional portion of horizontal slicing, (e) the fractional portion of vertical slicing with centered PWM, (f) the fractional portion of vertical slicing with non-centered PWM.
Figure 4:
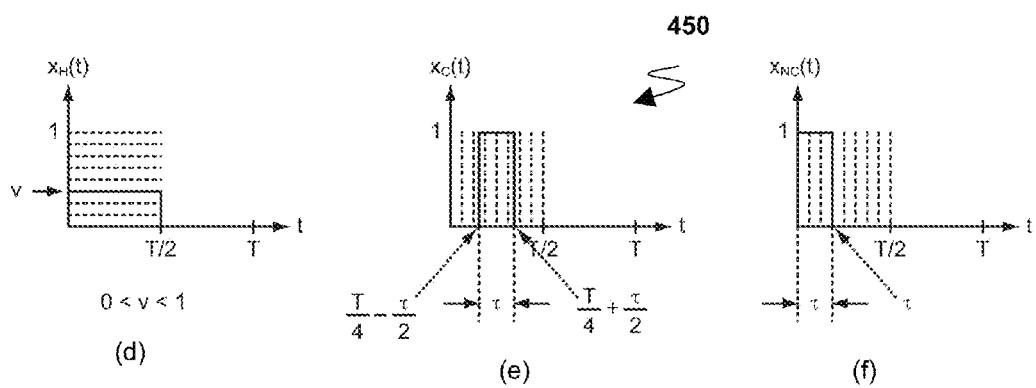

Referring now to FIG. 4, a graphical example of amplitude resolution improvement by (a) horizontal slicing, (b) vertical slicing with centered PWM, (c) vertical slicing with non-centered PWM is illustrated. To explain this issue, FIG. 4 first illustrates three different quantization methods 400 for adding an extra 3-bit resolution in either a voltage or current signal. For the DPA, the vertical axis in FIG. 4 represents the current or the conductance of the switching transistors, which is directly proportional to the output envelope, and its original resolution is 10 bits in the system of FIG. 1. FIG. 4-(a) shows horizontal slicing of a signal, which is a conventional quantization method for a DAC. Both FIG. 4-(b) and FIG. 4-(c) show vertical slicing of a signal where the output amplitude is controlled by the time interval of the vertically sliced signal. Note that the pulse in FIG. 4-(b) is located at the center, whereas that in FIG. 4-(c) is aligned at t=0. This quantization method is PWM whose pulsewidth has a limited number of quantized pulsewidths. Depending on the position of the additive pulse, the vertical slicing method could be categorized as centered PWM and non-centered PWM, as shown in FIG. 4-(b) and FIG. 4-(c).

For the horizontal slicing scheme, the resolution is set by available area and power of switching transistors along with device mismatch, which limits the minimum device size. In contrast, the resolution of the vertical slicing scheme is set by the time-resolution. Accordingly, the vertical slicing can achieve higher resolution than the horizontal slicing with the same minimum device size if the time-resolution is finer. In modern nanometer-scale CMOS technology, the time-resolution is getting better, thus employing PWM seems a better choice to improve the amplitude resolution of a DPA.

Referring now to the second portion 450 of FIG. 4, an amplitude resolution improvement mechanism by (d) the fractional portion of horizontal slicing, (e) the fractional portion of vertical slicing with centered PWM, (f) the fractional portion of vertical slicing with non-centered PWM is illustrated. The second portion 450 of FIG. 4 illustrates only the first fractional portions from FIG. 4, where T is the time period of an RF carrier signal, v is an voltage/current level generated by the unit switching device using horizontal slicing, and τ is a pulsewidth for vertical slicing. Note that the amplitude switches are only turned on during half the DCO period, $\frac{T}{2}$.

The full size of the voltage/current level generated by the unit switching device is normalized to '1'. In this example, the fractional word adds an extra 3-bit resolution with 8 extra amplitude levels. The pulse position of the PWM signal could be at the center of the first half cycle of the carrier signal (centered PWM), or it could be aligned with the main switching waveform (non-centered PWM).

Intuitively, all the signals from FIG. 4-(*d*), (*e*), (*f*) are the same in terms of power because the total area of the signals are the same. However, as pointed out in [7], which is incorporated herein by reference, they are equivalent only at DC. The Fourier transforms of the horizontal and vertical slicing signals are $$X_H(j\omega) = \int_0^{\frac{T}{2}} v \cdot e^{-j\omega t} dt = v \cdot \frac{2e^{-j\frac{\omega T}{4}} \cdot \sin\left(\frac{\omega T}{4}\right)}{\omega}$$

$$X_C(j\omega) = \int_{\frac{T}{4}-\frac{\tau}{2}}^{\frac{T}{4}+\frac{\tau}{2}} e^{-j\omega t} dt = \frac{2e^{-j\frac{\omega T}{4}} \cdot \sin\left(\frac{\omega \tau}{2}\right)}{\omega}$$

$$X_{NC}(j\omega) = \int_0^{\tau} 1 \cdot e^{-j\omega t} dt = \frac{2e^{-j\frac{\omega \tau}{2}} \sin\left(\frac{\omega \tau}{2}\right)}{\omega}$$

where $X_H(j\omega)$, $X_C(j\omega)$, and $X_{NC}(j\omega)$ are the Fourier transforms of the horizontal slicing, the centered PWM, and the non-centered PWM signals, respectively. In the examples of FIG. 4, v is ⅜, and τ is $$v \text{ is } \frac{3}{8}, \text{ and } \tau \text{ is } \frac{3}{8} \times \frac{T}{2}.$$

Figure 5:
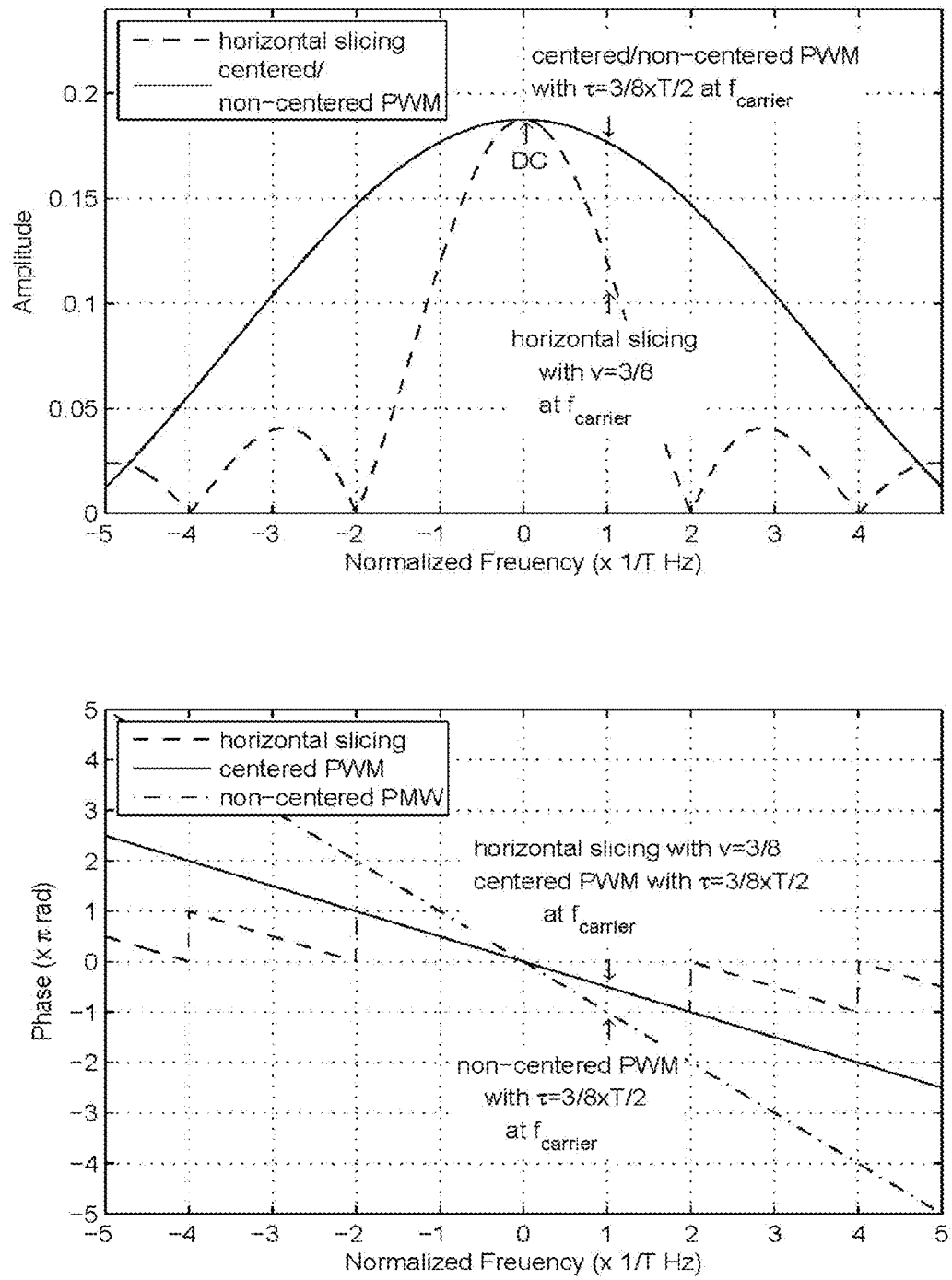
FIG. 5 illustrates a graphical example of frequency domain amplitude/phase comparison of horizontal slicing and vertical slicing (centered PWM and non-centered PWM) when $$v = \frac{3}{8} \text{ and } \tau = \frac{3}{8} \times \frac{T}{2}.$$

FIG. 5 illustrates the amplitudes and the phases of the Fourier transforms of each case, and it clearly shows that horizontal and vertical slicing is not the same at the carrier frequency, which is $$\frac{1}{T}$$

Hz. First of all, the amplitude of the Fourier transform of horizontal slicing is different from that of vertical slicing. Second of all, the phase of vertical slicing with non-centered PWM is different from that of horizontal slicing although the phase of centered PWM is the same as that of horizontal slicing. An RF-DAC is intended to generate a signal at a carrier frequency corresponding to an input digital code. Therefore, the vertical slicing signal in FIG. 5 creates an incorrect RF signal even though it creates an accurate DC signal.

An inaccurate RF signal from an RF-DAC leads to higher quantization noise. The Fourier transforms at a carrier frequency $$\left(\omega = \frac{2\pi}{T}\right)$$

should be examined for quantization noise analysis for an RF-DAC, and they are $$X_H(j\omega)\bigg|_{\omega=\frac{2\pi}{T}} = \frac{-jvT}{\pi} \quad (1)$$

$$X_C(j\omega)\bigg|_{\omega=\frac{2\pi}{T}} = \frac{-j\sin\left(\frac{\pi\tau}{T}\right)T}{\pi} \quad (2)$$

$$X_{NC}(j\omega)\bigg|_{\omega=\frac{2\pi}{T}} = (e^{-j(\pi\tau/T)} * \sin(\omega T/2) * T)/\pi \quad (3)$$

Figure 6:
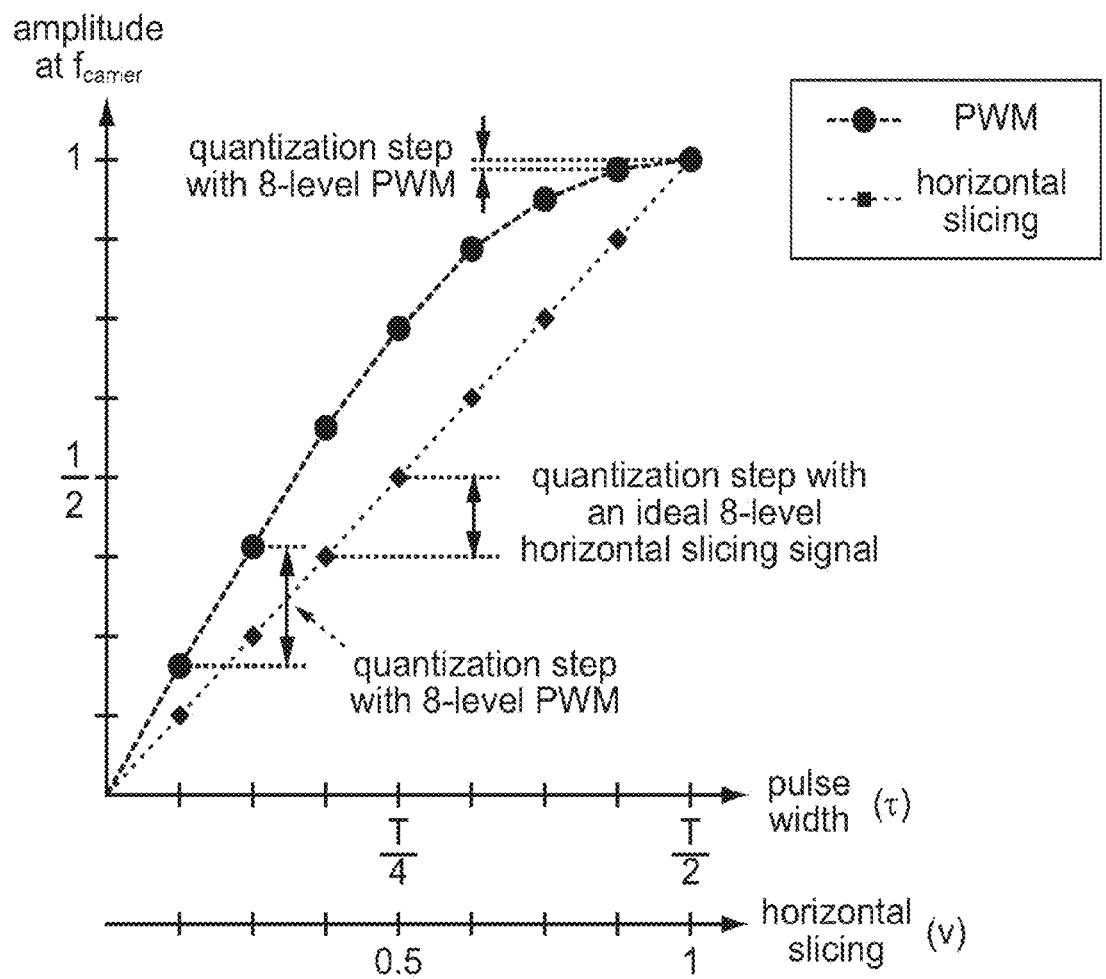
FIG. 6 illustrates a graphical example of amplitude quantization step at the carrier frequency of horizontal slicing signals and 8-level PWM signals from [8].

FIG. 6 depicts the amplitudes at the carrier frequency of the 8-level horizontal and vertical slicing signals, which are derived in (1) and (2) as a function of pulsewidth and horizontal slicing level. Note that the amplitudes of (2) and (3) are the same. The maximum amplitude at the carrier frequency is normalized to 1 for simple quantization error estimation, and Table 1 shows the RF amplitude for each input code and the corresponding quantization error. In Table 1, the range of the quantization error of vertical slicing is much larger than $$\frac{1}{16} = 0.0625.$$

It means that the quantization noise by vertical slicing is bigger than that of horizontal slicing. The quantization noise power can be estimated by a probability density function assuming the probability of error is uniformly distributed. The calculated noise power shows that horizontal slicing achieves 3-bit resolution while vertical slicing achieves only 0.9-bit resolution. Therefore, resolution improvement by PWM is severely impaired if the pulsewidth is chosen in such a way that the DC amplitude of a vertical slicing signal is matched with that of a horizontal slicing signal, as shown in FIG. 6 and Table 1.

TABLE 1

Quantization error by horizontal and centered PWM

|  | | horizontal slicing | | centered PWM | |
| --- | --- | --- | --- | --- | --- |
| original input | pulse width | amp at $f_C$ | quantization error | amp at $f_C$ | quantization error |
| 0-1/16 | 0 | 0 | -1/16-0 | 0 | -1/16-0 |
| 1/16-3/16 | $\frac{1}{8} \cdot \frac{T}{2}$ | 1/8 | -1/16-1/16 | 0.194 | 0.132 0.007 |
| 3/16-5/16 | $\frac{2}{8} \cdot \frac{T}{2}$ | 2/8 | -1/16-1/16 | 0.383 | 0.195 0.070 |
| 5/16-7/16 | $\frac{3}{8} \cdot \frac{T}{2}$ | 3/8 | -1/16-1/16 | 0.556 | 0.243 0.118 |
| 7/16-9/16 | $\frac{4}{8} \cdot \frac{T}{2}$ | 4/8 | -1/16-1/16 | 0.707 | 0.270 0.145 |
| 9/16-11/16 | $\frac{5}{8} \cdot \frac{T}{2}$ | 5/8 | -1/16-1/16 | 0.832 | 0.269 0.144 |

TABLE 1-continued

Quantization error by horizontal and centered PWM

| original input | pulse width | horizontal slicing | | centered PWM | |
|---|---|---|---|---|---|
| | | amp at $f_C$ | quantization error | amp at $f_C$ | quantization error |
| $^{11}/_{16}$-$^{13}/_{16}$ | $\frac{6}{8} \cdot \frac{T}{2}$ | $^{6}/_{8}$ | $-^{1}/_{16}$-$^{1}/_{16}$ | 0.924 | 0.236-0.111 |
| $^{13}/_{16}$-$^{15}/_{16}$ | $\frac{7}{8} \cdot \frac{T}{2}$ | $^{7}/_{8}$ | $-^{1}/_{16}$-$^{1}/_{16}$ | 0.981 | 0.168-0.043 |
| $^{15}/_{16}$-$^{16}/_{16}$ | $\frac{8}{8} \cdot \frac{T}{2}$ | $^{8}/_{8}$ | $-^{1}/_{16}$-0 | 1 | $-^{1}/_{16}$-0 |

Vertical slicing with non-centered PWM distorts the signal even further due to it phase discrepancy. The phase of the Fourier transforms in (1) and (2) is $$-\frac{\pi}{2}$$

regardless of v or τ, but the phase in (3) is dependent on τ. Accordingly, the phase of the Fourier transforms of the horizontal slicing signals and the non-centered PWM signals are different unless τ is $$\frac{T}{2}.$$

Thus, the phase of non-centered PWM should be compensated for the correct symbol representation.

Figure 7:
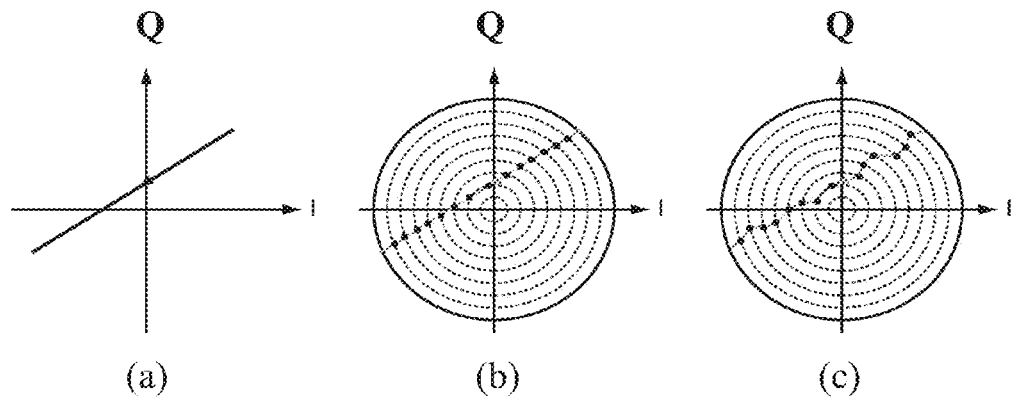
FIG. 7 illustrates a graphical example of symbol trajectories for an EDGE signal in I/Q plane, with (a) ideal trajectory (b) quantized trajectory without amplitude or phase error (c) quantized trajectory with phase error.

The importance of phase compensation is presented in FIG. 7. It illustrates the trajectories of an example of EDGE symbols in an I/Q plane with and without phase error. FIG. 7-(a) shows the ideal symbol trajectory without any amplitude/phase quantization. FIG. 7-(b) shows the symbol trajectory with amplitude quantization. There is no phase error in this case so that its spectrum will show only the noise due to the amplitude quantization error. Horizontal slicing and centered PWM signals will show this symbol trajectory. FIG. 7-(c) shows the trajectory with amplitude quantization and phase error. Even though it has the same amplitude quantization as 7-(b), the phase error results in uneven symbol trajectory, which will cause more noise in the spectrum.

Predistortion of PWM Signals

Amplitude distortion of PWM exists for both centered and non-centered PWM. In contrast, phase distortion is caused by only non-centered PWM. We will first discuss how to avoid or reduce amplitude distortion of centered PWM, which was briefly introduced in [6], and then discuss phase and amplitude distortion of non-centered PWM.

Predistortion of PWM Signal for Centered PWM

One solution to the amplitude discrepancy between horizontal slicing and centered PWM is choosing the pulsewidth for the vertical slicing such that its amplitude at the carrier frequency is the same as that of corresponding horizontal slicing.

$$X_H(j\omega)\big|_{\omega=\frac{2\pi}{T}} = X_C(j\omega)\big|_{\omega=\frac{2\pi}{T}} \quad (4)$$

$$\frac{-jvT}{\pi} = \frac{-j\sin\left(\frac{\pi\tau}{T}\right)T}{\pi}$$

$$v = \sin\left(\frac{\pi\tau}{T}\right)$$

Equation (4) shows how to choose the pulsewidth for the centered PWM signal. A centered PWM signal whose pulsewidth satisfies (4) has the same amplitude as the corresponding horizontal slicing signal at the carrier frequency. Note that the centered PWM signal has the same phase as that of the horizontal slicing signal. Thus, phase distortion is not a concern for a centered PWM signal.

TABLE 2

Pulsewidths that create the same amplitude at a carrier frequency as the corresponding horizontal slicing signals

| horizontal slicing | pulsewidth |
|---|---|
| 0 | 0 |
| $^{1}/_{8}$ | 0.0399 × T |
| $^{2}/_{8}$ | 0.0804 × T |
| $^{3}/_{8}$ | 0.122 × T |
| $^{4}/_{8}$ | 0.167 × T |
| $^{5}/_{8}$ | 0.215 × T |
| $^{6}/_{8}$ | 0.270 × T |
| $^{7}/_{8}$ | 0.339 × T |

Figure 8:
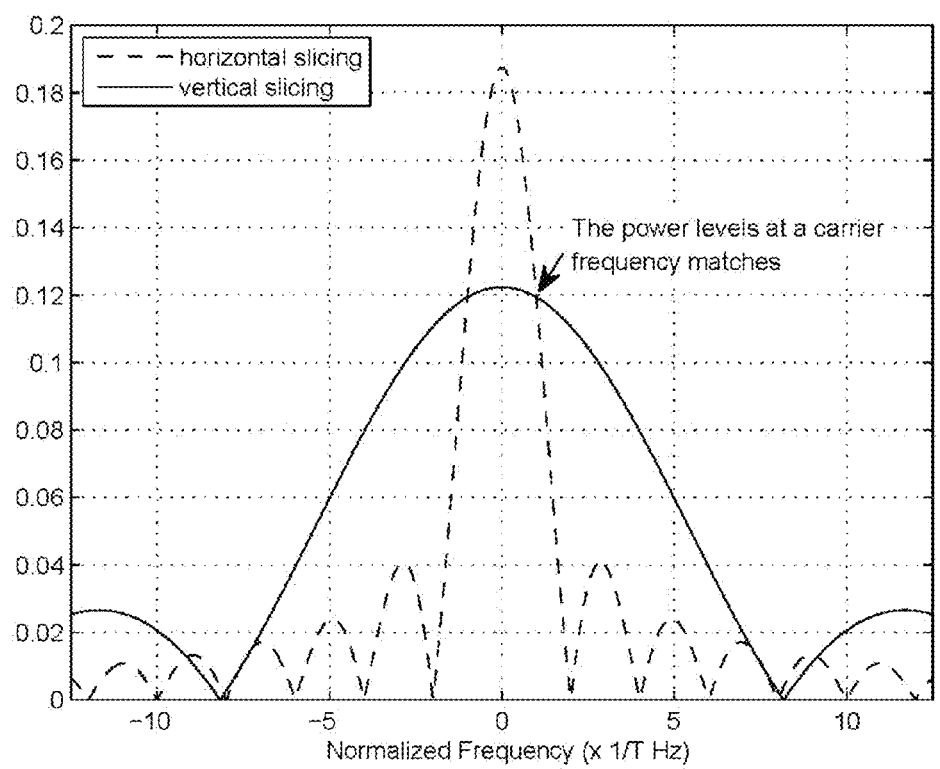
FIG. 8 illustrates a graphical example of frequency domain amplitude comparison of horizontal slicing and centered PWM when $$v = \frac{3}{8}$$

FIG. 8 depicts an example of the amplitude of the Fourier transform of the centered PWM signal satisfying (4). In FIG. 8, it is clear that the amplitude of the centered PWM signal at the carrier frequency is the same as that of the horizontal slicing signal. Table 2 shows an example of the pulsewidths, for which the amplitude and the phase at the carrier frequency is the same as those of the corresponding horizontal slicing signals. The amplitude resolution of the centered PWM signals employing the pulsewidths shown in Table 2 is also the same as that of horizontal slicing signals. Unfortunately, the pulsewidths shown in Table 2 are very challenging to generate without an accurate delay controller, such as a high precision DLL or a fine-resolution delay line. Therefore, such PWM generation is impractical.

TABLE 3

Pulsewidths, which are the multiples of $\frac{T}{16}$, and the equivalent horizontal slicing signals

| horizontal slicing | pulsewidth | horizontal slicing | pulsewidth |
|---|---|---|---|
| 0 | 0 | 0.707 | $\frac{4}{8} \times \frac{T}{2}$ |
| 0.194 | $\frac{1}{8} \times \frac{T}{2}$ | 0.831 | $\frac{5}{8} \times \frac{T}{2}$ |
| 0.383 | $\frac{2}{8} \times \frac{T}{2}$ | 0.924 | $\frac{6}{8} \times \frac{T}{2}$ |
| 0.556 | $\frac{3}{8} \times \frac{T}{2}$ | 0.981 | $\frac{7}{8} \times \frac{T}{2}$ |

A PWM signal is easier to generate when its pulsewidth is integer multiples of a certain stable delay. Table 3 shows an example in which the pulsewidths are integer multiples of $$\frac{T}{16}.$$

It also presents the corresponding horizontal slicing signals that satisfy (4). A simple delay chain can generate those pulsewidths shown in Table 3; hence, it is a better implementation choice. However, the relationship between the desired horizontal slicing signals and the pulsewidths shown in Table 3 is nonlinear. A predistortion digital LUT can be utilized to implement this mapping, where the contents of the predistortion LUT should be chosen such that the amplitude quantization error is minimized.

Table 4 presents an example of a predistortion digital LUT for mapping the input code to the appropriate pulsewidth of centered PWM. In the example of Table 4, the LUT maps the 5-bit input to 8-level pulsewidths. The LUT mapping linearizes the relationship between the input code and the output amplitude at the carrier frequency such that the amplitude quantization error is minimized. Note that the range of the quantization errors in Table 4 are sometimes larger than the maximum quantization error of the ideal 8-level signal, which is ±

$$\pm \frac{1}{16} = \pm 0.0625.$$

FIG. 6 explains the reason of the larger quantization noise of the LUT in Table 4 more clearly. The quantization step is larger than that of ideal 8-level horizontal slicing when the pulsewidths are relatively short, as shown in FIG. 6. Therefore, the quantization error using the predistortion LUT and 8-level centered PWM will be larger than that of the ideal 3-bit horizontal slicing. The quantization noise power of the centered PWM employing the LUT in Table 4 can be also calculated by probability density functions, and the calculated amplitude resolution at the carrier frequency is 2.6 bits.

As we have seen in Table 2 and Table 3, there are two options to linearize the RF power of a PWM signal: mapping uniform data input to non-uniform pulsewidths (Table 2), and mapping non-uniform data input to uniform pulsewidths (Table 3). Apparently, uniform-to-non-uniform mapping needs no sacrifice for achieving 3-bit resolution, while non-uniform-to-uniform mapping shows the resolution degradation by 0.4 bits. However, the pulsewidths in Table 3 are easy to generate using a simple delay chain. The predistortion LUT is also easy to implement in digital CMOS processes. Therefore, we propose to employ a predistortion LUT for centered PWM, which helps to minimize the overall system complexity with slight degradation of amplitude resolution.

TABLE 4

Look-up-table example with 5-bit input and 8-level centered PWM output

| original input | LUT input | pulsewidth selected | amp at $f_C$ | quantization error |
|---|---|---|---|---|
| 0-1/64 | 0 | 0 | 0 | 0<br>0.0156 |
| 1/64-3/64 | 1/32 | 0 | 0 | 0.0156<br>0.0469 |
| 3/64-5/64 | 2/32 | 0 | 0 | 0.0469<br>0.0781 |
| 5/64-7/64 | 3/32 | 0 | 0 | 0.0781<br>0.109 |
| 7/64-9/64 | 4/32 | $\frac{1}{8} \cdot \frac{T}{2}$ | 0.194 | −0.0857<br>0.0545 |
| 9/64-11/64 | 5/32 | $\frac{1}{8} \cdot \frac{T}{2}$ | 0.194 | −0.0545<br>−0.0232 |
| 11/64-13/64 | 6/32 | $\frac{1}{8} \cdot \frac{T}{2}$ | 0.194 | −0.0232<br>0.0804 |
| 13/64-15/64 | 7/32 | $\frac{1}{8} \cdot \frac{T}{2}$ | 0.194 | 0.00804<br>0.0393 |
| 15/64-17/64 | 8/32 | $\frac{1}{8} \cdot \frac{T}{2}$ | 0.194 | 0.0393<br>0.0705 |
| 17/64-19/64 | 9/32 | $\frac{1}{8} \cdot \frac{T}{2}$ | 0.194 | 0.0705<br>0.102 |
| 19/64-21/64 | 10/32 | $\frac{2}{8} \cdot \frac{T}{2}$ | 0.383 | −0.0858<br>−0.0546 |
| 21/64-23/64 | 11/32 | $\frac{2}{8} \cdot \frac{T}{2}$ | 0.383 | −0.0546<br>−0.0233 |
| ... | ... | ... | ... | ... |
| 53/64-55/64 | 27/32 | $\frac{5}{8} \cdot \frac{T}{2}$ | 0.831 | −0.00335<br>−0.0279 |
| 55/64-57/64 | 28/32 | $\frac{5}{8} \cdot \frac{T}{2}$ | 0.831 | 0.0279<br>0.0592 |
| 57/64-59/64 | 29/32 | $\frac{6}{8} \cdot \frac{T}{2}$ | 0.924 | −0.00333<br>−0.00201 |
| 59/64-61/64 | 30/32 | $\frac{6}{8} \cdot \frac{T}{2}$ | 0.924 | −0.00201<br>0.0292 |
| 61/64-63/64 | 31/32 | $\frac{7}{8} \cdot \frac{T}{2}$ | 0.981 | −0.0277<br>0.0359 |
| 63/64-64/64 | 31/32 | $\frac{7}{8} \cdot \frac{T}{2}$ | 0.981 | −0.0156<br>0 |

Predistortion of PWM Signals for Non-Centered PWM

In contrast to the centered PWM, phase compensation is required for non-centered PWM as the phase of the Fourier transforms of the horizontal slicing signals and the non-centered PWM signals are different. Therefore, the phase error created by a non-centered PWM signal should be compensated. The novel and inventive PWM scheme is verified with a digital polar transmitter including a PLL, which can manipulate the phase of an RF signal. The PLL can compensate the phase error, but it requires an additional LUT for the phase signal path.

Not only the phase but also the amplitude of the Fourier transform of non-centered PWM is different from that of centered PWM. Equations (1), (2), and (3) are the Fourier transforms of the fractional part of the amplitude signal only. The Fourier transforms of the complete signals including both the integer and the fractional portions are:

$$X_{H,total}(j\omega)\Big|_{\omega=\frac{2\pi}{T}} = \frac{-jVT}{\pi} + \frac{-jvT}{\pi} \quad (5)$$

$$X_{C,total}(j\omega)\Big|_{\omega=\frac{2\pi}{T}} = \frac{-jVT}{\pi} + \frac{-j\sin\left(\frac{\pi\tau}{T}\right)T}{\pi} \quad (6)$$

$$X_{NC,total}(j\omega)\Big|_{\omega=\frac{2\pi}{T}} = -jVT/\pi + (e^{-j(\pi T/T)} * \sin(\pi\tau/T) * T)/\pi \quad (7)$$

where:

$X_{H,total}(j\omega)$, $X_{C,total}(j\omega)$, and $X_{NC,total}(j\omega)$ are the Fourier transforms of the horizontal slicing, the centered PWM, and the non-centered PWM signals, respectively, including both the integer and fractional part. V is the integer portion, which is generated by a DPA. In some example embodiments, as described herein, the DPA may encompass a subset of the full DPA (e.g. a subset of the full power generation stage). The phases of the integer part and the fractional part in equations (5) and (6) are the same. Therefore, if the fractional portion of a centered PWM signal in equation (6) is the same as that of the targeted horizontal slicing signal in equation (5), then the amplitudes of the complete signals are the same. In other words, τ for centered PWM is only dependent on v not V. However, as shown in equation (7), the phase of the fractional part of a non-centered PWM signal is different from that of the integer part; hence, the amplitude of the final signal is a vector sum in complex plane. FIG. 9 illustrates the situation more clearly. The goal of choosing the appropriate pulsewidth τ for centered and non-centered PWM is to make the total signal including the integer portion the same as the ideal horizontal slicing signal, which is depicted in FIG. 9-(a). For centered PWM, it is a simple task because the pulsewidth τ is determined by only v, and it is independent of the integer portion V. For non-centered PWM, however, the phase of the fractional portion is not the same as that of the integer portion; as a result, the amplitude of the total signal is a vector sum of the integer and the fractional parts, as shown in FIG. 9-(c). The vector sum is a function of the integer part as well as the pulsewidth τ. Therefore, the amplitude predistortion LUT for non-centered PWM should take the integer part into consideration while the LUT for centered PWM only takes the fractional part as its input. In other words, the size of the amplitude predistortion LUT for non-centered PWM should be bigger than the LUT for centered PWM.

As an example, the full-length size of the amplitude predistortion LUT for the non-centered PWM should be 32768 words (15-bit=10-bit+5-bit) if the integer word of the amplitude is 10 bits and the fractional word is 5 bits. However, the size of the amplitude predistortion LUT for centered PWM will be only 32 words (5-bit) because the LUT takes only the fractional part as an input. Accordingly, non-centered PWM requires much bigger amplitude predistortion LUT than centered PWM.

Nevertheless, under certain conditions, the size of the amplitude predistortion LUT for non-centered PWM can be significantly reduced by approximation. According to the equation below, the phase of the integer part is always imaginary, and the phase of the fractional part has both real and imaginary parts that depend on τ. Note that the real part comes only from the fractional word. The equation below can be separated into the real and imaginary part, and the real part can be neglected if the integer portion, V, is much larger than the fractional portion, as follows.

$$X_{NC,total}(j\omega)\Big|_{\omega=\frac{2\pi}{T}} = \frac{-jVT}{\pi} + \frac{e^{-j\frac{\pi\tau}{T}}\sin\left(\frac{\pi\tau}{T}\right)T}{\pi} = \quad (8)$$

$$\frac{-jVT}{\pi} - \frac{j\sin\left(\frac{\pi\tau}{T}\right)\sin\left(\frac{\pi\tau}{T}\right)T}{\pi} + \frac{\cos\left(\frac{\pi\tau}{T}\right)\sin\left(\frac{\pi\tau}{T}\right)T}{\pi}$$

$$X_{NC,total}(j\omega)\Big|_{\omega=\frac{2\pi}{T}} \approx \frac{-jVT}{\pi} - \frac{j\sin\left(\frac{\pi\tau}{T}\right)\sin\left(\frac{\pi\tau}{T}\right)T}{\pi}$$

$$if V \gg \cos\left(\frac{\pi\tau}{T}\right)\sin\left(\frac{\pi\tau}{T}\right)$$

Equation (8) is valid if V is large enough. In FIG. 10, we can easily see that θ will become very small as V, which represents the integer part of the baseband signal, increases such that the real part becomes negligible compared to the imaginary part. Therefore, equation (8) is a very good approximation for the large amplitude signals. For an EDGE signal, the amplitude is always larger than certain amplitude in order to keep its peak-to-minimum ratio of signal around 16.4 dB. V might be large enough to satisfy the condition for equation (8) if the baseband input signal is an EDGE signal. Validity of equation (8) for an EDGE signal is verified by simulations and the results will be presented later. If equation (8) is valid, the same size of the amplitude predistortion LUT as centered PWM can be employed for amplitude predistortion of non-centered PWM. The LUT should be realized based on the following equation:

$$X_H(j\omega)\Big|_{\omega=\frac{2\pi}{T}} = X_{NC}(j\omega)\Big|_{\omega=\frac{2\pi}{T}} \quad (9)$$

$$\frac{-jvT}{\pi} = \frac{-j\sin\left(\frac{\pi\tau}{T}\right)\sin\left(\frac{\pi\tau}{T}\right)T}{\pi}$$

$$v = \sin\left(\frac{\pi\tau}{T}\right)\sin\left(\frac{\pi\tau}{T}\right)$$

Furthermore, FIG. 9-(c) indicates that not only an amplitude predistortion LUT, but also a phase compensation LUT, should take the integer part of the amplitude into account because the phase of the non-centered PWM signal depends on the integer word as well as τ. As a result, the size of the phase predistortion LUT will be huge. However, some approximation technique can help to reduce its size, too.

FIG. 10 shows a comparison 1000 of an ideal horizontal slicing signal and a non-centered PWM counterpart 1000. Note that the entire complex plane is rotated by 90° counterclockwise for easy $\tan^{-1}$ approximation. The amount of phase distortion by non-centered PWM is θ, which is $$\Theta = \tan^{-1}\left(\frac{\frac{\cos\left(\frac{\pi\tau}{T}\right)\sin\left(\frac{\pi\tau}{T}\right)T}{\pi}}{\frac{VT}{\pi} + \frac{\sin\left(\frac{\pi\tau}{T}\right)\sin\left(\frac{\pi\tau}{T}\right)T}{\pi}}\right) \quad (10)$$

$$= \tan^{-1}\left(\frac{\cos\left(\frac{\pi\tau}{T}\right)\sin\left(\frac{\pi\tau}{T}\right)}{V + \sin\left(\frac{\pi\tau}{T}\right)\sin\left(\frac{\pi\tau}{T}\right)}\right)$$

Thus, the amount of phase predistortion should be:

$$\varphi = -\theta \quad (11)$$

$$= -\tan^{-1}\left(\frac{\cos\left(\frac{\pi\tau}{T}\right)\sin\left(\frac{\pi\tau}{T}\right)}{V + \sin\left(\frac{\pi\tau}{T}\right)\sin\left(\frac{\pi\tau}{T}\right)}\right)$$

where φ is the required phase predistortion for a non-centered PWM signal. Approximation of $\tan^{-1}$ by Taylor series is $$\tan^{-1}(x) = x - \tfrac{1}{3}x^3 + \tfrac{1}{5}x^5 - \tfrac{1}{7}x^7 \ldots$$

$$\tan^{-1}(x) \approx x \text{ if } x \text{ is close to '0'} \quad (12)$$

Since θ converges to 0 if the integer part increases, as shown in FIG. 10-(b), equation (12) is valid as far as the integer part is large enough. With this approximation, equation (11) becomes a simple closed-form expression as follows:

$$\varphi = -\tan^{-1}\left(\frac{\cos\left(\frac{\pi\tau}{T}\right)\sin\left(\frac{\pi\tau}{T}\right)}{V + \sin\left(\frac{\pi\tau}{T}\right)\sin\left(\frac{\pi\tau}{T}\right)}\right) \quad (13)$$

$$\approx -\frac{\cos\left(\frac{\pi\tau}{T}\right)\sin\left(\frac{\pi\tau}{T}\right)}{V + \sin\left(\frac{\pi\tau}{T}\right)\sin\left(\frac{\pi\tau}{T}\right)}$$

$$\approx -\frac{\cos\left(\frac{\pi\tau}{T}\right)\sin\left(\frac{\pi\tau}{T}\right)}{V} = -\frac{1}{V}\cdot\cos\left(\frac{\pi\tau}{T}\right)\sin\left(\frac{\pi\tau}{T}\right)$$

$$\text{if } V \gg \sin\left(\frac{\pi\tau}{T}\right)\sin\left(\frac{\pi\tau}{T}\right)$$

Equation (13) implies that the phase predistortion LUT can be broken into two smaller LUTs and a multiplier. One LUT takes the integer word of the amplitude signal and calculates $$\frac{1}{V}$$

while the other LUT takes the fractional word and calculates $$\cos\left(\frac{\pi\tau}{T}\right)\sin\left(\frac{\pi\tau}{T}\right).$$

The total amount of the phase compensation is the multiplication of those two outputs. In this way, the phase predistortion LUT can be implemented with less complexity. In a polar transmitter, the LUT to compensate AM-PM distortion of RF PA is likely to already exist in the system. In this case, the LUT for $$\frac{1}{V}$$

can be combined with the existing AM-PM predistortion LUT, and only a small LUT with the fractional word inputs calculating $$\cos\left(\frac{\pi\tau}{T}\right)\sin\left(\frac{\pi\tau}{T}\right)$$

and a multiplier are required additionally.

The validity of equation (13) is confirmed, as shown in FIG. 11. The integer word is 10 bits, which ranges from 0 to 1023, and the fractional word is 5 bits (32 levels). The approximation in equation (13) agrees well with equation (11) when the input code is over 100 although they differ when the input code is less than 6. Note that the input code represents the amplitude of an input baseband signal in a polar transmitter although we are currently dealing with phase compensation for non-centered PWM. For an EDGE signal, the input code is always larger than certain amplitude in order to keep its peak-to-minimum ratio as explained earlier. As a result, equation (13) is a very good approximation for EDGE, as verified by the later illustrated simulations.

The resolution of the phase path of a polar transmitter is another restriction to affect complexity of the entire system. The size of a phase predistortion LUT depends on not only the input resolution but also the output resolution, which goes into the phase input of a PLL. If an ADPLL is employed, the resolution of the phase input of an ADPLL also affects complexity of its building blocks, such as a DCO, a digital loop filter, and a TDC. The required phase resolution of the non-centered PWM method can be determined by simulations, and the results with different phase resolutions are presented later.

Note that the phase compensation 1200 for non-centered PWM should occur instantly (i.e., having wide enough bandwidth) as illustrated in FIG. 12. It means that an ADPLL should employ a special method such as a two-point modulation. R. B. Staszewski et al. in 'Just-in-time gain estimation of an RF digitally-controlled oscillator for digital direct frequency modulation', published in IEEE Trans. Circuits Syst. II, vol. 50, issue 11, pp. 887-892, November 2003 [10], which is incorporated herein by reference, employs a feed-forward path for an instant phase/frequency shift, and also uses a predistortion path to compensate closed-loop counteract; hence, the instant phase shift shown in FIG. 12 is possible.

Amplitude Resolution Improvement Employing PWM

Given the previous analysis, the architecture for improving the amplitude resolution of a polar transmitter employing a PWM generator will be described. The architecture for centered and non-centered PWM should differ because of their different characteristics. Firstly, we will discuss the architecture for centered PWM, as disclosed in [6], with the architecture for non-centered then introduced. A simple delay chain circuit, which can be used in a PWM generator, will be also described and its circuit-level simulation results will be shown. Finally, centered and non-centered PWM methods will be compared.

Architecture Employing Centered PWM

Referring now to FIG. 13, an example of an architecture 1300 of a polar transmitter with a PWM generator, which creates centered PWM signals, is illustrated in accordance with some example embodiments of the invention. Note that the architecture 1300 is augmented from the original polar transmitter architecture depicted in FIG. 1. The building blocks drawn with the bold lines are added to the original polar transmitter to improve its amplitude resolution. In FIG. 13, the PWM generator 1302 generates $2^N$PWM-level centered PWM signals. The original amplitude signal is $N_A$-bit. The integer part is $N_{int}$ bits, and it drives the DPA's switching transistors directly. The $N_{frac}$-bit signals, which is the fractional part of the amplitude signal, go into the amplitude predistortion LUT 1304 for centered PWM, which is realized based on equation (4). The LUT 1304 has $N_{frac}$-bit inputs and $N_{PWM}$-bit outputs. It will occupy a very small area in modern CMOS processes because its size is only $2^{Nfrac}$ words. In this example embodiment, we used a 5-bit fractional word as input and a 12-level centered PWM signal as output, which are represented by 32 4-bit data words in the predistortion LUT 1304. Therefore, the size of the required LUT for centered PWM is: $2^5$-word×4-bit=128-bit. Note that this LUT can also be merged with the LUT for DPA in the original polar transmitter so as to minimize the area.

Referring now to FIG. 14, an example of a conceptual block diagram 1400 of a centered PWM generator and its timing diagram are illustrated in accordance with some example embodiments of the invention. In one example, two pulse signals, $d_1$ and $d_2$, are adjusted with two simple delay chains 1402 and 1404 in order to produce the desired pulse output.

In order to achieve better centering ability, a Pulse Center block 1306, 1406 in FIG. 13 and FIG. 14, which can be implemented with either a DLL or fine resolution delay lines, manipulates the main clock delay, thereby controlling the pulse position of the PWM signal. The Pulse Center block 1306/1406 plays an important role in that it keeps the position of the PWM at the center of the first half cycle of the carrier signal as depicted in FIG. 4(b) across process variation. If the PWM is not located at the center, it causes phase distortion of the output signal. Channel switching is another issue since pulse position is relative to the clock period T. Therefore, the relative pulse position changes if the clock period is changed. The Pulse Center block 1306/1406 can change the delay for the clock input of the PWM generator ($clk_1$) such that the pulse position is always centered no matter what TX channel is selected.

Referring now to FIG. 15, an example of a polar transmitter 1500 with non-centered PWM, is illustrated in accordance with some example embodiments of the invention. The novel architecture is augmented from the original polar transmitter architecture in FIG. 1. In FIG. 15, the PWM generator makes $2^{NPWM}$-level non-centered PWM signals. The phase LUT 1502 takes the $N_{frac}$-bit fractional word of the amplitude signal as an input, and it calculates $$\cos\left(\frac{\pi\tau}{T}\right)\sin\left(\frac{\pi\tau}{T}\right),$$

as per equation (3). The $N_{int}$-bit integer word of the amplitude signal goes to the building block 1504, which calculates the inverse. It could be an arithmetic logic or an LUT. In most commercial polar transmitter systems, there is an AM-PM LUT. Hence, the $$\frac{1}{in}$$

block 1504 can be simply combined with the existing LUT. The combination of the phase LUT 1502 and the $$\frac{1}{in}$$

block 1504 calculates the approximated phase predistortion value as explained earlier. The additional LUT 1506 for amplitude path is also used, and it takes the fractional word of the amplitude signal. The content of the LUT 1506 is derived according to equation (9), which is an approximation. Note that the Pulse Center block is unnecessary in this case because non-centered PWM is always aligned with the main clock as far as the PWM generator 1508 is referenced to the main clock.

Referring now to FIG. 16, an example of a conceptual block diagram 1600 of a non-centered PWM generator and its timing diagram is illustrated, in accordance with some example embodiments of the invention. In this case, the generated PWM is aligned with the rising edge of the main clock. If necessary, the building block in FIG. 16 can be easily modified such that the PWM is aligned with the falling edge of the clock instead of the rising edge. Then, the content of the amplitude and phase predistortion LUTs should be changed, but the overall architecture will remain the same. Note that FIG. 16 requires only one delay chain 1602, as compared to the centered PWM generator shown in FIG. 14. Therefore, the architecture of FIG. 16 is much simpler overall to implement.

The PWM generators in FIG. 14 and FIG. 16 require a delay chain 1402/1404/1602 where the delay is controllable digitally. A simple inverter-based delay chain 1700 for the PWM generator is described in this section. FIG. 17 illustrates the described circuit. The inverters $inv_1$, $inv_2$, $inv_3$, $inv_4$ are cascaded, and their input nodes can be set to the desired logic levels by force in such a way that some inverters are held to a certain voltage while the others propagate signals from the previous stages. There are three possible states for each input node of the inverters $inv_1$-$inv_4$: high, low, and local floating. When the input node of the inverter $inv_1/inv_2/inv_3/inv_4$ is set to floating, the voltage of that node is determined by the previous stage; thus, that inverter $inv_1/inv_2/inv_3/inv_4$ propagates a digital signal. By controlling the number of the inverters propagating a signal, one can change the total propagation delay of the circuit.

FIG. 18 illustrates how the described circuit creates four inverter delays 1800. In the reset state, the inputs of all four inverters $inv_1$-$inv_4$ are held at a certain voltage by pre-set devices at the input nodes of the inverters $inv_1$-$inv_4$ such that the delay chain's output is low. In order to generate four inverter delays, the inputs of the last three inverters $inv_2$-$inv_4$ are set to floating. Now, the first stage determines the output. Therefore, after the input of the first inverter $inv_1$ goes to high, the signal propagates through the four inverters. The total delay is:

delay=$t_{clk-to-start1}$+4·delay$_{inv}$ where: delay$_{inv}$ is an inverter delay, and $t_{clk-to-start1}$ is the time to take for the input of $inv_1$ to become high, which is the delay from the clock to the start of the signal. $t_{clk-to-start1}$ is determined by the size of one of the pre-set devices, $P_1$, and the total capacitance of the input node of $inv_1$.

FIG. 19 illustrates the case of a three inverter delay 1900. In order to create three inverter delays, the inputs of the last two inverters $inv_3$ and $inv_4$ become floating. When the input of the first two inverters $inv_1$ and $inv_2$ are set to high and low, respectively, the signal propagates through the last three inverters $inv_2$-$inv_4$ creating three inverter delays. Note that the input of $inv_1$ is still low before $t_{clk-to-start1}$. Thus, $inv_1$ attempts to make the output, which is the input of $inv_2$, high before $t_{clk-to-start1}$ while $N_2$ tries to make the input of $inv_2$ low. If $N_2$ is much larger than the size of $inv_1$, then the input of $inv_2$ will become low by force even before $t_{clk-to-start1}$. In this case, $t_{clk-to-start2}$ the time to take for the input of $inv_2$ to become low, will be determined by the size of $N_2$ and the input node capacitance of $inv_2$. If the size of $N_2$ is small, then $t_{clk-to-start2}$ will be longer than $t_{clk-to-start1}$ because the input of $inv_2$ can become low only after the input of $inv_1$ becomes high. In any cases, the total delay of FIG. 19 is:

$$delay = t_{clk-to-start2} + 3 \cdot delay_{inv}$$

Employing smaller inverters relative to the pre-set devices decreases the clock-to-start time, but increases the inverter delay. This trade-off should be taken into account for transistor sizing of the described delay chain circuit.

The final propagation delay value of the described delay chain circuit is controlled by digital signals. Hence, the digital circuits that generate the proper control signals for each stage are required. Moreover, those signals should be referenced to the clock in that the output of the delay chain should be a delayed clock. FIG. 20 depicts the details of the delay generator 2000 including the digital circuits to create the control signals for each stage. Note that AND and OR gates with one input fed by the clock are required so that all the control signals are aligned with the clock. In addition, both clk and $\overline{clk}$ are required, as shown in FIG. 20. $\overline{clk}$ is usually available in PLLs using a differential LC oscillator.

One drawback of the described circuit of FIG. 20 is that the loading for the clock signal gets bigger and bigger as the number of inverter stages increases. However, the main clock is also supposed to drive a DPA, which is composed of 1024 equivalent unit switching transistors [1, 2]. Compared to the clock loading by the switching transistors, the additional loading caused by the delay stage is relatively small. Therefore, the additional clock loading will not require major design modification of the conventional DPA circuits.

The post layout simulations of the described delay chain circuit are done in a nanoscale CMOS process, such as 65 nm CMOS process. The total number of inverter chains designed is 25, and the circuit simulation results will be applied to the behavioural-level simulations of the described system in the next section. Ideally, the delay created by the described circuit is integer multiples of one inverter delay plus a clock-to-start time as explained earlier. However, the delay of each inverter will be different because of device mismatch. The delay variation of the inverters is estimated by Spectre Monte Carlo simulations. The estimated delay variation will also be taken into account for the behavioural simulations of the described architecture in the next section.

FIG. 21 illustrates a graphical example 2100 of a mismatch-averaged propagation delay of the circuit 2000 of FIG. 20. FIG. 22 depicts the mean delays and the standard deviations of the inverter stage. FIG. 22 illustrates the incremental delay 2200 by each inverter stage, and the delay of $inv_{25}$ includes the contribution of a clock-to-start time. By enabling more inverters, the total propagation delay will increase in steps of around 19.5 psec., which is one inverter delay. However, the minimum propagation delay of the circuit is 35 psec. because the minimum delay is one inverter delay plus a clock-to-start delay. The standard deviation of each delay is less than 1 psec., which is about 5% of the nominal delay, and this result will be used for the behavioural simulations as described below.

FIG. 23 illustrates the mean delay of each inverter stage 2300 except for $inv_{25}$, of which delay includes the clock-to-start delay. It shows that the delay goes slightly up and down alternatively as the input code increases. This is because of the delay mismatch of rise and fall times of the inverters.

Comparison of Centered and Non-Centered PWM
Centered and non-centered PWM show quite different characteristics as explained above, so that they require different architectures. The PWM generators for each case also show different features in a practical implementation. Moreover, the resolution of each PWM generator is different even if they have the same delay chains with the same unit delay, assuming that the example PWM generators shown in FIG. 14 and FIG. 16 are employed.

Referring now to FIG. 24, a graphical example 2400 of a resolution comparison of centered and non-centered PWM generators with a unit delay of $$\frac{1}{8} \times \frac{T}{2}$$

(a) centered PWM (b) non-centered PWM is illustrated, in accordance with some example embodiments of the invention. FIG. 24 explains the reason for the different PWM resolutions. The unit delay time is $$\frac{T}{16}.$$

The number of possible centered PWM signals is only '4' because the pulse should be located at the center in all cases, but the number of non-centered PWM is '8' as shown. Consequently, the time resolution of non-centered PWM is twice the time resolution of centered PWM. Theoretically, non-centered PWM can show better amplitude resolution improvement than centered PWM. However, it is worth mentioning that the amplitude resolution of non-centered PWM is also affected by the resolution of the phase path of the system, although the phase resolution of a digital PLL is digitally controlled and it is typically made very fine without much burden. The amplitude resolution of non-centered PWM might also reduce for a certain baseband signal, such as a signal with large peak-to-minimum ratio, unless the system employs the full size LUTs for the amplitude and phase predistortion rather than the reduced size LUTs based on approximation. For an EDGE transmitter employing an ADPLL, non-centered PWM could be the better choice since the baseband amplitude of an EDGE signal has a limited peak-to-minimum ratio as mentioned before.

TABLE 5

Architectures with centered PWM vs. non-centered PWM

|  | centered PWM | non-centered PWM |
| --- | --- | --- |
| Amplitude LUT | required | required |
| Size of amplitude LUT | $2^{N}$frac-word | $2^{N_{int}+N}$frac-word (theory) $2^{N}$frac-word (approximation) |
| PWM generator circuit | 2 delay chains required | 1 delay chain required |
| Resolution of PWM generator | $\frac{T}{4 \cdot delay_{unit}}$ – level | $\frac{T}{2 \cdot delay_{unit}}$ – level |
| Phase compensation | not required | required |
| Pulse positioning | Pulse position control required | Pulse position control not required |

Table 5 summarizes the comparison of the described architectures with the centered and non-centered PWM. There is a trade-off for PWM choice between the necessity of phase compensation and PWM generator's complexity. Obviously, a non-centered PWM generator is easier to implement than a centered PWM generator, and it achieves better time resolution than the centered PWM counterpart. However, non-centered PWM requires phase compensation. Non-centered PWM would be the preferred choice for a polar transmitter with an AM-PM predistortion LUT because the built-in phase predistortion LUT can be used for phase compensation of PWM signals as long as the resolution of the phase path is enough and the PLL in a polar transmitter have the ability for instant phase shift such as two-point modulation.

Behavioural Simulations of the Example Architectures with the PWM Scheme

The effect of the described amplitude resolution improvement using centered and non-centered PWM is verified by a behavioural simulator, such as that described by M. Perrott in 'CppSim behaviour simulator package' (available at http://www.cppsim.com) [10]. The simulation files and the detailed description can be found in M. Park's publication 'Behavioural simulation of an amplitude resolution improvement for an RF-DAC employing PWM scheme' (available at http://www.cppsim.com/tutorials.html) [11]. The main objective of the described architecture is to improve the amplitude resolution of a DPA. Thus, only the amplitude path is modeled in detail while the phase path is modeled as ideal. The baseband input signal is the amplitude component of an EDGE signal. The output spectrum will be compared with that of the original DPA's behavioural model to show the improvement.

In the simulation model, the input to the DPA is 10 bits, but the amplitude signal of the baseband EDGE is '15' bits. Thus, $N_{int}$ is '10', and $N_{frac}$ is '5'. The 5-bit fractional word controls the pulsewidth of the PWM signal. A 25-stage delay chain is modeled in CppSim, and the nominal delay of each stage is 20 ps, which is the worst-case delay of an inverter stage based on post-layout simulations in 65 nm CMOS.

The non-linearity of a DPA is modeled based on the original 10-bit DPA circuit. An amplitude predistortion LUT to linearize this nonlinearity is included in the simulation models given that the measured nonlinearity of the DPA is typically known from M. Perrot's 'Fast and accurate behavioural simulation of fractional-n frequency synthesizers and other PLL/DLL circuits', Proc. 39$^{th}$ Design Automation Conference, 2002 pp. 498-503 [12], which is incorporated herein by reference.

Delay mismatch effect of the delay chain is also included in the behavioural simulations. Although the Spectre Monte Carlo simulation results show about 5% of delay mismatch, we used 10% of delay mismatch for the behavioural simulations to be on the conservative side.

Simulation Results with Centered PWM

The amplitude predistortion LUT for centered PWM is implemented based on the simulated nominal delay of the delay elements, and its input data is 5 bits because $N_{frac}$ is 5. The carrier frequency in the simulation is 1.0417 GHz, of which the period is 960 ps. Although this is not a legal GSM/EDGE frequency, we chose it merely for simulation convenience since 960-ps is the integer multiple of the nominal delay of the delay stages, 20-ps.

FIG. 25 shows the output spectrum 2500 of an original 10-bit DPA, and a DPA with centered PWM. It also compares the spectrum of the centered PWM with and without the amplitude predistortion LUT. The quantization noise of a DPA creates the noise skirt shown in FIG. 25. The quantization noise of the system employing 12-level PWM with the LUT is about 18 dB lower than that of the original 10-bit DPA, which means the amplitude resolution of the DPA improves by around 2.7 bits. However, the quantization noise of the centered PWM without the LUT is almost 10 dB worse than that of the PWM with the LUT.

Theoretically, the amplitude predistortion LUT for centered PWM can be built based on the exact delay of each delay stage when delay mismatch exists. However, it is impractical since a precise method of measuring the delay is required. In this example embodiment, we assume that the LUT for PWM is implemented based on the known nominal delay of the delay elements. In other words, the LUT is calibrated for only the process variation, and does not take care of the delay mismatch. Therefore, any delay mismatch, which is not compensated by the LUT, degrades the overall performance. FIG. 26 shows the output spectrum 2600 showing that 10% delay mismatch raises the quantization noise by up to 3 dB, which leads to 2.2-bit resolution improvement over the original 10-bit DPA. Even with the 10% delay mismatch, the spectrum of the centered PWM method satisfies the 3GPP spectral mask for the associated RX band.

FIG. 27 depicts the output spectrum 2700 showing how much amplitude resolution is degraded when the position of PWM is not exactly at the center. Up to 6 dB more quantization noise is expected when the position of the PWM signal is offset by 18 psec. In a practical implementation, the Pulse Center block 1306 in FIG. 13 will control the pulse position properly. Therefore, the pulse position error should not limit the performance.

Simulation Results for Non-Centered PWM

FIG. 28 shows the output spectrum 2800 of an original 10-bit DPA and a DPA employing non-centered PWM with and without phase compensation. The time resolution of the non-centered PWM generator used in the simulations is 20 ps, which is the nominal unit delay of the delay chain circuit shown later. Delay mismatch is not considered. The amplitude and phase predistortion is done without the approximation technique, and the size of each LUT is $2^{15}$ words in this case since the baseband input data is 15 bits as was in the simulations presented later. The quantization noise of the DPA with non-centered PWM is more than 20 dB lower than that of the original 10-bit DPA, which means the amplitude resolution is improved by at least 3 bits. Due to the higher time resolution than centered PWM, the amplitude resolution improvement is much better with non-centered PWM, but requiring an overhead of LUTs. FIG. 28 also reveals that the quantization noise of the DPA with non-centered PWM becomes much higher if it lacks phase compensation. Thus, phase compensation is crucial for the non-centered PWM.

In the CppSim simulations, phase compensation is done by a variable delay block. The simulation time step is 10 psec., but required time resolution for phase compensation is much less than femto second for the simulation in FIG. 28. Instead of decreasing the simulation time step, the signal discretization technique introduced in M. Perrot's 'Fast and accurate behavioural simulation of fractional-n frequency synthesizers and other PLL/DLL circuits', Proc. 39$^{th}$ Design Automation Conference, 2002 pp 498-503 [13], which is incorporated herein by reference, is employed for fast simulations.

FIG. 29 shows the output spectrum 2900 showing that the amplitude predistortion with approximation for non-centered PWM, which is introduced in equation (8), is adequate for an EDGE signal. The difference between the spectra for non-centered PWM with ideal amplitude LUT and approximated amplitude LUT is less than ±0.2 dB. Therefore, the reduced-size amplitude LUT with approximation can be employed for simpler implementation without resolution degradation.

FIG. 30 shows the output spectrum 3000 proving that the phase compensation with approximation is also good enough for an EDGE signal. The spectra of the ideal and approximated phase compensation are almost the same in FIG. 30, and the difference between the two spectra is less than ±0.4 dB. Accordingly, the architecture with reduced size LUTs described in FIG. 15 is sufficient for an EDGE signal.

Even with the reduced-size amplitude and phase predistortion LUTs based on approximation, non-centered PWM shows better resolution improvement than centered PWM mainly because the time resolution of the non-centered PWM generator is twice as much as that of the centered PWM, as pointed out in FIG. 24. In practice, however, the resolution of the phase path in a digital PLL should be taken into consideration for the non-centered PWM case. FIG. 31 shows the output spectra 3100 with different phase resolutions. It is obvious that the quantization noise rises if the phase resolution is low. Compared with FIG. 26, FIG. 31 shows that non-centered PWM is worse than centered PWM if the resolution of the phase path is lower than 0.05° even with the twice time resolution of the PWM generator. Therefore, the phase resolution of a PLL is another design constraint for non-centered PWM, in general. Note that the typical phase resolution in ADPLL is 1.5 Hz, which will make about 10000 times better resolution than 0.005° at 1 GHz of carrier frequency. Thus, the phase resolution is not an issue.

The Spectre Monte Carlo simulation results illustrated later are applied to the behavioural simulations to see the mismatch effect on the spectrum. 10% of standard deviation is used for the behavioural simulations.

FIG. 32 shows an example of the output spectrum 3200 for non-centered PWM with 10% delay mismatch. The phase resolution is 0.005° in the simulations. The amplitude and phase LUT are realized based on approximation to reduce the size of the LUTs. Delay mismatch increases the quantization noise level by around 3 dB. In other words, delay mismatch lowers the resolution by around 0.5 bits. Therefore, the amplitude resolution improves by about 2.5 bits if non-centered PWM is employed with 10% delay mismatch.

Referring now to FIG. 33, a block diagram of a wireless communication unit (sometimes referred to as a mobile subscriber unit (MS) in the context of cellular communications or a user equipment (UE) in terms of a $3^{rd}$ generation partnership project (3GPP™) communication system) is shown, in accordance with some embodiments of the invention. The wireless communication unit 3300 contains an antenna 3302 preferably coupled to a duplex filter or antenna switch 3304 that provides isolation between receive and transmit chains within the MS 3300.

For completeness, the receiver chain, as known in the art, includes receiver front-end circuitry 3306 (effectively providing reception, filtering and intermediate or base-band frequency conversion). The front-end circuitry 3306 is serially coupled to a signal processing function 3308. An output from the signal processing function 3308 is provided to a suitable output device 3310, such as a speaker, screen or flat panel display. A controller 3314 maintains overall subscriber unit control and is coupled to the receiver front-end circuitry 3306 and the signal processing function 3308 (generally realised by a digital signal processor (DSP) 3330). The controller 3314 is also coupled to a memory device 3316 that selectively stores operating regimes, such as decoding/encoding functions, synchronisation patterns, code sequences, RSSI data and the like.

In accordance with examples of the invention, the memory device 3316 may comprise the aforementioned LUT.

As regards the transmit chain, this essentially includes an input device 3320, such as a microphone or a keypad, coupled to the signal processing module 3308 and thereafter direct to a digitally controlled power amplifier (DPA) 3324 and to the antenna 3302. The DPA 3324 is operationally responsive to the controller 3314 that, in one example embodiment comprises, or is operably coupled to, a PWM generator arranged to generate a dynamically incremental PWM signal.

The signal processor function 3308 in the transmit chain may be implemented as distinct from the processor in the receive chain. Alternatively, a single processing function 3308 may be used to implement processing of both transmit and receive signals, as shown in FIG. 33. Clearly, the various components within the wireless communication unit 3300 can be realised in discrete or integrated component form, with an ultimate structure therefore being merely an application-specific or design selection.

FIG. 34 illustrates an example of a RF-DAC 3400 employing PWM, according to example embodiments of the invention. The RF-DAC 3400 is operably coupled to a digitally controlled oscillator (DCO) 3425 (which in this example and in a number of further examples will not formally be part of the RF-DAC and may be configured to provide an input to an RF-DAC IC) that receives a tuning word input signal 3420, which in this example is zero-order hold (ZOH) at a sampling rate ranging from FREF to 100's of MHz. The DCO 3425 has an output of a pulse width of ~500 psec based on a plurality of codes that provides the primary input to the RF-DAC 3400. The output 3430 from the DCO 3425 is input to a first 'AND' logic module 3445 of an integer DPA 3435 where it is 'AND'ed with an amplitude control word (ACW) signal. The output from the first 'AND' logic module 3445 is input to the integer part of the power generation stage, which in this example is in a form of a switch transistor 3450 for amplification. The output 3455 of the switch transistor 3450 is input to a matching network 3460 and a matched output signal 3495 produced.

The dynamically incremental PWM signal is generated using a pulse slimmer circuit 3465 and a fractional DPA 3490 comprising one or more transistors for use with the one or more LSBs. The pulse slimmer circuit 3465 comprises a DTC 3475 arranged to receive the output 3430 from the DCO 3425 and controlled by a delay control signal 3470. The output 3480 from the DTC 3475, together with the output 3430 from the DCO 3425 is input to a second 'AND' logic module 3485, which is input to the transistor of the fractional DPA 3490. The output of the fractional DPA 3490 controls the output of the switch transistor 3450 by injecting a well-controlled delta energy into the matching network 3460. A graphical representation of the signal at the DPA output node 'X' 3455, i.e. before the matching network 3460, is illustrated. The graphical representation of the signal at the DPA output node 'X' 3455 illustrates the summation of the regular MOS switch 3450 in the integer DPA 3435 and one switch in the fractional DPA 3490 that undergoes incremental PWM (iPWM). In this manner, the PWM signal is applied only on the LSB bit(s) (and LSB transistor(s)).

FIG. 35 illustrates timing waveforms 3500 of the example RF-DAC employing PWM of FIG. 34 according to example embodiments of the invention. The timing waveforms 3500 comprise a clock signal (CKV) 3505, a delayed clock signal (CKV_DLY) 3515, and the PS_Out signal 3520 from the second 'AND' logic module 3485, which controls the switching on of the transistor of the fractional DPA 3490.

The duty cycle of the PS_Out signal from the second 'AND' logic module 3485 is shown in graph 3525, with the duty cycle varying 3530 between 0% and 50%. A delay of the edges of the PS_Out signal 3520 with respect to the CKV clock signal 3505 is illustrated in waveforms 3540, where each step contributes about 20 psec/500 psec to the LSB step. Thus, by turning on additional inverters, the timing resolution can be configured to be approximately 20 psec. The pulse width of the 1 GHz clock is 500 ps, so 20 psec/500 ps is the relative resolution or granularity.

FIG. 36 illustrates an example of a delay cell design 3600, adapted to employ example embodiments of the invention, which can be employed to produce the delay control signal 3480 of FIG. 34. The delay cell design 3600 in this example comprises a plurality of serially coupled r-s circuits 3640, which may be implemented as shown in circuit 3610. The set (s) port of the plurality of serially coupled r-s flip flops 3640 are each fed from a plurality of respective 'AND' logic modules 3630. The inputs of the respective 'AND' logic modules 3630 are fed from the clock (CLK) source 3625 and data bits d[0]-d[n]. In this manner, the clock signal delay output from the delay cell design 3600 can be dynamically controlled via the data bits d[0]-d[n], which can be determined based on values stored in the LUT.

FIG. 37 illustrates two different example quantization methods for adding an extra 3-bit resolution in either a voltage or current signal of the example RF-DAC employing PWM of FIG. 34 and thereby improving an amplitude resolution of the RF-DAC according to example embodiments of the invention. A first example quantization method uses horizontal slicing 3700, and a second example quantization method uses vertical slicing 3725. For the DPA, the vertical axis 3705 represents the current or the conductance of the switching transistors, which is directly proportional to the output envelope.

In the first example quantization method using horizontal slicing 3700, which is a conventional quantization method for a DAC, the original resolution is 10 bits in the system 10-bit quantization 3710 with an additional 3-bit quantization resolution 3715 provided using horizontal slicing to achieve the ideal 13-bit signal (i.e. a 10-bit quantization 3710 plus an additional 3-bit quantization 3715) that would typically be required to meet the EDGE noise specification. For the horizontal slicing scheme, the resolution is set by the available area and power of switching transistors along with device mismatch which limits the minimum device size.

The second example quantization method uses vertical slicing 3725 of a signal, where the output amplitude is controlled by a time interval of the vertically sliced signal. Thus, this quantization method is PWM-based, whose pulsewidth has a limited number of quantized pulsewidths. The original resolution is 10 bits in the system 10-bit quantization 3735 with an additional 3-bit quantization resolution 3740 provided using vertical slicing to achieve the ideal 13-bit signal (i.e. a 10-bit quantization 3735 plus an additional 3-bit quantization 3740) that would typically be required to meet the EDGE noise specification. The resolution of the vertical slicing scheme is set by time-resolution. Accordingly, the vertical slicing scheme is able to achieve higher resolution than the horizontal slicing with the same minimum device size if time-resolution is higher. In modern nanometer-scale CMOS technology, time-resolution is becoming higher. Thus, employing PWM is better choice to improve the amplitude resolution of a DPA.

FIG. 38 illustrates graphically a comparison 3800 of the two quantization methods to achieve the 3-bit quantization in the bit-quantization example employing PWM of FIG. 34 and FIG. 37 according to example embodiments of the invention. Thus, a first graphical example illustrates a fractional portion of horizontal slicing 3805. A second graphical example illustrates a fractional portion of vertical slicing 3825. On the time axis 3820, 3835, T is the time period of an RF carrier signal. In the first graphical example of horizontal slicing 3805, the ⅜ y-axis point 3810 is a voltage/current level generated by the unit switching device. In the second graphical example of vertical slicing 3825 (T/2*⅜) is a pulsewidth 3840 for vertical slicing. Note that the amplitude switches are only turned on during half the DCO period, i.e. T/2. The full size of the voltage/current level generated by the unit switching device is illustrated as being normalized to '1'. In this example, the fractional word adds an extra 3-bit resolution with, therefore, '8' extra amplitude levels. The pulse position of the PWM signal is assumed to be at the center of the first half cycle of the carrier signal in this case. Intuitively, both signals from FIG. 38 are the same in terms of power, because the total area of the signals is the same. As pointed out above, however, they are equivalent only at DC 3850. Notably, FIG. 38 clearly illustrates that the horizontal and vertical slicing is not the same at the carrier frequency which is 1/T Hz. An RF-DAC is intended to generate a signal at a carrier frequency corresponding to an input digital code. Therefore, the vertical slicing signal in FIG. 37 and FIG. 38 creates an incorrect RF signal even though it creates an accurate DC signal. An inaccurate RF signal from an RF-DAC leads to higher quantization noise.

FIG. 39 illustrates a bit-quantization example 3900 using digital pre-distortion for selecting a PWM pulse width of FIG. 38 according to example embodiments of the invention. Here, a 3-bit quantization process 3920 is used, providing 8 respective pulse widths 3935, 3940 to be applied to the PWM signal. Each of the 3-bit quantization levels 3925 correspond 3930 to a respective pulse width 3935, 3940.

Referring now to FIG. 40, a flowchart 4000 of an operation of a RF-DAC employing iPWM is illustrated according to example embodiments of the invention. The flowchart starts at step 4010 and moves on to step 4020 where an input signal, for example an amplitude sample, is received by the IC and is to be transmitted at a particular time index or point in time. The amplitude sample is then divided into constituent integer and fractional parts, as shown in step 4030. The integer part is then output to the integer part of the RF-DAC in step 4040 and the fractional part output to the PWM modulator in step 4050. In accordance with the content of the integer part and the fractional part, the RF duty cycle per PWM modulator output is either narrowed or broadened to obtain an incremental or decremental PWM signal, as shown in step 4060. The integer part of the RF-DAC output and the narrowed or broadened RF duty cycle are then combined in step 4070 to produce an output signal. A determination is then made as to whether the transmission has ended in step 4080, and if not the process advances to the next time index or time point in step 4090 and loops back to step 4020. If the transmission has completed in step 4080, the process ends in step 4085.

Thus, example embodiments of the invention have described a new architecture for amplitude resolution improvement of an RF-DAC using time as the key signal domain. The technique employs incremental PWM achieved with a fine precision of an inverter delay. Since it exploits the fine timing resolution of nanometer-scale CMOS technology, it does not require tighter device matching.

Furthermore, example embodiments of the invention have categorized PWM into centered and non-centered PWM, and showed that they have different characteristics. The transmitter structures for both centered and non-centered PWM is described. They are compared in the context of the performance and implementation methods. Detailed behavioural simulations show that the architecture employing non-centered PWM is better than that of centered PWM. The simulations with non-centered PWM show about 2.5-bit resolution improvement in a 1-GHz RF-DAC generating the EDGE envelope, assuming 20-psec. time granularity of delay chains and including 10% delay mismatch. The described architecture can simply augment a digitally-intensive polar transmitter without major architectural modifications. The building blocks required for the described architectures are a PWM generator, a fine-resolution delay controller, and amplitude/phase predistortion LUTs for PWM signals.

Although some aspects of the invention have been described with reference to their applicability to an EDGE implementation of an UMTS™ (Universal Mobile Telecommunication System) cellular communication system and in particular to a UMTS™ wireless communication unit of a $3^{rd}$ generation partnership project (3GPP) system, it will be appreciated that the invention is not limited to this particular cellular communication system. It is envisaged that the concept described above may be applied to any other cellular communication system.

Example embodiments of the invention have determined that an incremental PWM of DPA approach may offer improved performance over the traditional $\Sigma\Delta$ noise shaping approach. Example embodiments of the invention may benefit from a reduced phase noise using an incremental PWM approach as the PWM generated signal undergoes a division of 30 dB (i.e., 10*log 10(1024)-noise power) reduction. Example embodiments of the invention may benefit from a use of a single inverter noise contribution, which would typically add 2nV/sqrt (Hz).

Example embodiments of the invention may benefit from only applying the incremental PWM signal to the one or more least significant bit (LSB) transistor(s).

Example embodiments of the invention may benefit from preserving a main digitally controlled power amplifier structure and coupling the incremental PWM circuit or module thereto.

Example embodiments of the invention may benefit from starting with a lower quantization level and may benefit from requiring a lower clock rate. Example embodiments of the invention using an incremental PWM approach may benefit from a 15 psec delay in the time domain, which corresponds to >14 bits of amplitude resolution.

Example embodiments of the invention may be achieved using much lower silicon area and power than known techniques. Example embodiments of the invention may benefit from superior re-programmability. Example embodiments of the invention may benefit from being suitable for multi-radio or multi-mode or multi-standard systems.

Example embodiments of the invention may also add invertor stages in parallel, for example in situations or applications where there may be limited range.

In particular, it is envisaged that the aforementioned inventive concept can be applied by a semiconductor manufacturer to any integrated circuit comprising a digitally controlled power generation stage, for example in a form of a switch transistor, for example those of the MediaTek™ RF-SoC family of wireless products. It is further envisaged that, for example, a semiconductor manufacturer may employ the inventive concept in a design of a stand-alone device, such as a silicon-on-chip (SoC) device, or application-specific integrated circuit (ASIC), any other sub-system element and/or discrete hardware/firmware/software components.

It will be appreciated that, for clarity purposes, the above description has described embodiments of the invention with reference to different functional units and processors. However, it will be apparent that any suitable distribution of functionality between different functional units or processors, for example with respect to the beamforming module or beam scanning module, may be used without detracting from the invention. For example, functionality illustrated to be performed by separate processors or controllers may be performed by the same processor or controller. Hence, references to specific functional units are only to be seen as references to suitable means for providing the described functionality, rather than indicative of a strict logical or physical structure or organization.

Aspects of the invention may be implemented in any suitable form including hardware, software, firmware or any combination of these. The invention may optionally be implemented, at least partly, as computer software running on one or more data processors and/or digital signal processors or configurable module components such as FPGA devices. Thus, the elements and components of an embodiment of the invention may be physically, functionally and logically implemented in any suitable way. Indeed, the functionality may be implemented in a single unit, in a plurality of units or as part of other functional units.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individually listed, a plurality of means, elements or method steps may be implemented by, for example, a single unit or processor. Additionally, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to 'a', 'an', 'first', 'second', etc. do not preclude a plurality.

Thus, an improved amplitude resolution of an RF-DAC IC and method therefor have been described, wherein the aforementioned disadvantages with prior art arrangements have been substantially alleviated.

LIST OF REFERENCES

[1] R. Staszewski, J. Wallberg, S. Rezeq, C.-M. Hung, O. Eliezer, S. Vemulapalli, C. Fernando, K. Maggio, R. Staszewski, N. Barton, M.-C. Lee, P. Cruise, M. Entezari, K. Muhammad, and D. Leipold, "All-digital PLL and transmitter for mobile phones," *IEEE J. Solid-State Circuits*, vol. 40, no. 12, pp. 2469-2482, December 2005.

[2] J. Mehta, R. B. Staszewski, O. Eliezer, S. Rezeq, K. Waheed, M. Entezari, G. Feygin, S. Vemulapalli, V. Zoicas, C.-M. Hung, N. Barton, I. Bashir, K. Maggio, M. Frechette, M.-C. Lee, J. Wallberg, P. Cruise, N. Yanduru, "A 0.8 mm² all-digital SAW-less polar transmitter in 65 nm EDGE SoC," *Proc. of IEEE Solid-State Circuits Conf.*, pp. 58-59, February 2010.

[3] A. Jerng and C. G. Sodini, "A wideband ΔΣ digital-RF modulator for high data rate transmitters," *IEEE J. Solid-State Circuits*, vol. 42, no. 8, pp. 1710-1722, August 2007.

[4] P. Eloranta, P. Seppinen, S. Kallioinen, T. Saarela, and A. P"arssinen, "A Multimode Transmitter in 0.13 um CMOS Using Direct-Digitial RF Modulator," *IEEE J. Solid-State Circuits*, vol. 42, no. 12, pp. 2774-2784, December 2007.

[5] R. B. Staszewski, "Digital deep-submicron CMOS frequency synthesis for RF wireless applications," Ph.D. thesis, Univ. of Texas at Dallas, August 2002.

[6] M. Park, M. H. Perrott, and R. B. Staszewski, "A Time-Domain Resolution Improvement of an RF-DAC," *IEEE Tans. Circuits Syst. II*, vol. 57, no. 7, pp. 517-521, July 2010.

[7] S. E. Meninger and M. H. Perrott, "A fractional-N frequency synthesizer architecture utilizing a mismatch compensated PFD/DAC structure for reduced quantization-induced phase noise," *IEEE Trans. Circuits Syst. II*, vol. 50, issue 11, pp. 839-849, November 2003.

[8] M. Nielsen and T. Larsen, "An RF Pulse Width Modulator for Switch-Mode Power Amplification of Varying Envelope Signals," *Proc. Silicon Monolithic Integrated Circuits in RF Syst. Top. Meeting*, pp. 277-280, January 2007.

[9] M. Perrott, "Cppsim behavior simulator package." [Online]. Available: http://www.cppsim.com

[10] R. B. Staszewski, D. Leipold, and P. T. Balsara, "Just-in-time gain estimation of an RF digitally-controlled oscillator for digital direct frequency modulation," *IEEE Trans. Circuits Syst. II*, vol. 50, issue 11, pp. 887-892, November 2003.

[11] M. Perrott, "Fast and accurate behavioral simulation of fractional-n frequency synthesizers and other pll/dll circuits," *Proc.* 39th Design Automation Conference, 2002, pp. 498-503.

[12] M. Park, "Behavioral simulation of an amplitude resolution improvement for an RF-DAC employing PWM scheme," [Online]. Available: http://www.cppsim.com/tutorials.html

[13] J. Mehta, V. Zoicas, O. Eliezer, R. B. Staszewsk, S. Rezeq, M. Entezari, and P. T. Balsara, "An efficient linearization scheme for a digital polar EDGE transmitter," *IEEE Trans. on Circuits Syst. II*, vol. 57, no. 3, pp. 193-197, March 2010.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit comprising:
a digitally-controlled power generation stage for converting an input signal to a radio frequency (RF) carrier, the digitally-controlled power generation stage comprising a plurality of selectable switching devices capable of adjusting an envelope of the RF carrier; and
a pulse width modulator (PWM) generator arranged to generate a PWM control signal according to a fractional word and operably coupleable to the plurality of selectable switching devices of the digitally-controlled power generation stage;
wherein the PWM generator inputs the PWM control signal to a subset of the plurality of the selectable switching devices such that a PWM signal adjusts the envelope of the RF carrier output from the digitally-controlled power generation stage.

2. The integrated circuit of claim 1 wherein the integrated circuit comprises a radio-frequency digital-to-amplitude converter (RF-DAC) comprising the digitally-controlled power generation stage, wherein the RF-DAC comprises at least one clock input for receiving a digital carrier signal and at least one data input for receiving an input digital envelope signal.

3. The integrated circuit of claim 1 wherein the plurality of selectable switching devices comprises an array of digitally-controlled switches coupled to both a first clock input and a first data input, wherein a first portion of the array of digitally-controlled switches is arranged to generate the envelope of the RF carrier output from the digitally-controlled power generation stage with an amplitude substantially proportional to a signal at the first data input and wherein a second portion of the array of digitally-controlled switches is arranged to generate an additive RF signal to be added to the envelope of the RF carrier via the PWM signal.

4. The integrated circuit of claim 1 wherein the PWM generator comprises a delay controller arranged to control a delay of the PWM control signal that controls the PWM signal adjusting the envelope RF carrier output from the digitally-controlled power generation stage.

5. The integrated circuit of claim 1 wherein the PWM generator comprises a plurality of inverters, a number of which are dynamically selected to set a pulse width of the PWM control signal provided to the subset of the plurality of selectable switching devices such that the PWM signal adjusts the envelope output RF carrier output from the digitally-controlled power generation stage.

6. The integrated circuit of claim 1 wherein the PWM signal is added to the envelope RF carrier output from the digitally-controlled power generation stage to control a signal timing of the digitally-controlled power generation stage.

7. The integrated circuit of claim 1 wherein the PWM generator provides the PWM control signal to the subset of the plurality of the selectable switching devices such that either a centered PWM signal or a non-centered PWM signal adjusts the envelope RF carrier output from the digitally-controlled power generation stage dependent upon a relative pulse position of the input signal to the digitally-controlled power generation stage.

8. The integrated circuit of claim 7 further comprising a pulse center module arranged to adjust a delay of a main clock signal employed by the integrated circuit to control the relative pulse position of the centered PWM signal.

9. The integrated circuit of claim 1 further comprising a memory operably coupleable to the PWM generator and arranged to store a plurality of amplitude and/or phase parameters associated with dynamically generating a non-centered PWM signal.

10. The integrated circuit of claim 9 wherein the memory is arranged to store a plurality of amplitude and/or phase predistortion parameters associated with the PWM control signal, such that the PWM signal is predistorted based on at least one of the plurality of amplitude and/or phase predistortion parameters.

11. The integrated circuit of claim 7 wherein the PWM generator is arranged to generate a dynamically non-centered incremental PWM signal when a baseband amplitude of a phase-modulated RF carrier has a limited peak-to-minimum ratio.

12. The integrated circuit of claim 1 wherein the subset of switching devices is/are activated for a limited period of time within a radio frequency burst of a digitally-controlled power generation stage transmission.

13. The integrated circuit of claim 12 wherein the subset of switching devices is/are activated during a positive half-cycle of a RF period within the radio frequency burst of the digitally-controlled power generation stage transmission.

14. The integrated circuit of claim 9 further comprising a multiplier operably coupled to the memory that comprises at least two sub-memory elements, such that a first memory is responsive to an integer word of an amplitude signal to be applied to the digitally-controlled power generation stage to produce a first $$\left(\frac{1}{V}\right)$$

output and a second memory is responsive to the fractional word to produce a second $$\left(\cos\left(\frac{\pi\tau}{T}\right)\sin\left(\frac{\pi\tau}{T}\right)\right)$$

output such that a phase compensation to be applied in generating the non-centered PWM signal is a multiplication of the first and second memory outputs.

15. The integrated circuit of claim 9 wherein the memory is additionally arranged to store polar co-ordinate data associated with the digitally-controlled power generation stage.

16. The integrated circuit of claim 1 wherein the digitally-controlled power generation stage is capable of controlling an envelope of a phase-modulated RF carrier.

17. A method of controlling an envelope of a radio frequency (RF) carrier output from a digitally-controlled power generation stage comprising a plurality of selectable switching devices, the method comprising:
generating a pulse width modulator (PWM) control signal according to a fractional word;
selecting a subset of the plurality of selectable switching devices to receive the PWM control signal; and, in response thereto
generating a PWM signal to adjust the envelope of the RF carrier output from the digitally-controlled power generation stage.

18. The method of claim 17 further comprising receiving an input signal to be transmitted, wherein the input signal is split into an integer part and a fractional part.

19. The method of claim 18 further comprising inputting the fractional part to a PWM generator to produce the PWM control signal in response thereto.

20. The method of claim 18 wherein adjusting the envelope RF carrier output from the digitally-controlled power generation stage comprises adding the integer part of the input signal to the generated PWM signal.

21. The method of claim 17 wherein generating the PWM signal to adjust the envelope RF carrier output from the digitally-controlled power generation stage comprises adjusting a RF duty cycle of the PWM control signal.

22. A wireless communication unit comprising:
a digitally-controlled power generation stage for converting an input signal to a radio frequency (RF) carrier, the digitally-controlled power generation stage comprising a plurality of selectable switching devices capable of adjusting an envelope of the RF carrier; and
a pulse width modulator (PWM) generator arranged to generate a PWM control signal according to a fractional word and operably coupleable to the plurality of selectable switching devices of the digitally-controlled power generation stage; wherein the PWM generator inputs the PWM control signal to a subset of the plurality of the selectable switching devices such that a PWM signal adjusts the envelope of the RF carrier output from the digitally-controlled power generation stage.

* * * * *